(12) United States Patent
Tanoue et al.

(10) Patent No.: US 10,103,036 B2
(45) Date of Patent: Oct. 16, 2018

(54) PACKING METHOD FOR SEMICONDUCTOR DEVICE

(71) Applicant: Renesas Electronics Corporation, Tokyo (JP)

(72) Inventors: Hiroaki Tanoue, Gunma (JP); Kei Goto, Gunma (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/489,775

(22) Filed: Apr. 18, 2017

(65) Prior Publication Data
US 2018/0005845 A1 Jan. 4, 2018

(30) Foreign Application Priority Data
Jun. 30, 2016 (JP) ................. 2016-129848

(51) Int. Cl.
*H01L 21/48* (2006.01)
*H01L 23/31* (2006.01)
*H01L 23/495* (2006.01)

(52) U.S. Cl.
CPC ...... *H01L 21/4839* (2013.01); *H01L 23/3114* (2013.01); *H01L 23/4952* (2013.01); *H01L 23/49513* (2013.01); *H01L 23/49555* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2924/181* (2013.01)

(58) Field of Classification Search
None
See application file for complete search history.

(56) References Cited

U.S. PATENT DOCUMENTS 5,499,717 A    3/1996  Hayashi

FOREIGN PATENT DOCUMENTS

JP    07-101461 A     4/1995
JP    2011-240945 A   12/2011

*Primary Examiner* — Kimberly Rizkallah
*Assistant Examiner* — Bo Bin Jang
(74) *Attorney, Agent, or Firm* — Mattingly & Malur, PC

(57) ABSTRACT

A packing method for a semiconductor device includes a step of preparing the semiconductor device that has a sealing body having a principal surface and a plurality of leads, and a step of preparing a base carrier tape that has a peripheral portion, a step portion, and a pocket portion. The method further includes a step of placing the semiconductor device in the pocket portion, a step of bonding a cover tape to the step portion in such a manner that the sealing body is pressed against the base carrier tape, and a step of winding the base carrier tape with the semiconductor device placed therein and with the cover tape bonded thereto, around a tape reel. The base carrier tape includes a principal surface of the peripheral portion, a principal surface of the step portion, and a principal surface of the pocket portion.

15 Claims, 20 Drawing Sheets

PACKING METHOD FOR SEMICONDUCTOR DEVICE

CROSS-REFERENCE TO RELATED APPLICATIONS

The disclosure of Japanese Patent Application No. 2016-129848 filed on Jun. 30, 2016 including the specification, drawings and abstract is incorporated herein by reference in its entirety.

BACKGROUND

The present invention relates to a packing method for a semiconductor device having a lead protruding from a side face of a sealing body, for example, and more particularly relates to a technique that is effectively applied to a packing method for a surface mount semiconductor device having a gullwing lead.

Japanese Unexamined Patent Application Publication No. Hei 7(1995)-101461 discloses a technique that places an electronic part in a pocket portion of a carrier tape, and then closes the pocket portion with a cover tape having an engaging portion. The engaging portion in which a concave portion for supporting an upper portion of the electronic part is fitted into an opening of the pocket portion.

Japanese Unexamined Patent Application Publication No. 2011-240945 discloses an embossed carrier tape in which a position regulating rib is provided in a periphery of a pedestal on which a product to be placed is mounted, to prevent deformation, damage, or the like of the product to be placed while being moved.

SUMMARY

The aforementioned embossed carrier tape (hereinafter, referred to as a carrier tape) is used as a method for shipping and carrying a QFP (Quad Flat Package) or SOP (Small Outline Package) semiconductor device, for example. The semiconductor device is placed in a semiconductor-device placing portion (referred to as a pocket portion) of an embossed base carrier tape, and a cover tape is bonded to a principal surface side of the base carrier tape to cover the pocket portion and the semiconductor device, so that the carrier tape is prepared. Subsequently, the carrier tape is wound around a tape reel, and shipment and conveyance are performed in that state. The carrier tape has an advantage of enabling conveyance of a large number of semiconductor devices to improve production efficiency, as compared with a tray.

When the carrier tape is wound around the tape reel, a rear surface side (a side in which the pocket portion projects) of the base carrier tape is arranged on a center side (a tape-reel core side) and the principal surface side of the base carrier tape (a side to which the cover tape is bonded) is arranged on an outer side in terms of a relation with a mounting machine that mounts the semiconductor device on a mounting substrate after shipment and conveyance.

Because the carrier tape is wound along a circumference of a circle centered at the core of the tape reel, a bottom surface of the pocket portion of the base carrier tape is warped to be convex outwardly from the center. Further, the degree of the convex warp becomes larger, because the radius of curvature becomes smaller as the carrier tape gets closer to the center. Because of the convex warp of the bottom surface of the pocket portion, it is confirmed as a failure that the semiconductor device moves in the pocket portion, so that a lead of the semiconductor device comes in contact with an inner wall of the pocket portion or the like and is deformed. In particular, it is confirmed that this failure can easily occur in the carrier tape at a closer location to the core of the tape reel. This deformation of the lead of the semiconductor device causes a mounting failure when the semiconductor device is mounted on the mounting substrate, reducing a yield of the semiconductor device in shipping and carrying steps.

That is, improvement of the yield of the semiconductor device is required in a packing method for the semiconductor device.

Other problems and novel features will be apparent from the description of the present specification and accompanying drawings.

A packing method for a semiconductor device according an embodiment includes a step of preparing a semiconductor device including a sealing body that has a first principal surface and a plurality of leads, a step of preparing a base carrier tape including peripheral portions, a step portion between the peripheral portions, and a pocket portion formed in the step portion, and a step of placing the semiconductor device in the pocket portion. Further, the packing method includes a step of bonding a cover tape to the step portion to press the sealing body against the base carrier tape, and a step of winding the base carrier tape with the semiconductor device placed therein and with the cover tape bonded thereto, around a tape reel. The base carrier tape has second principal surfaces of the peripheral portions, a third principal surface of the step portion, and a fourth principal surface of the pocket portion. At a stage in which the cover tape is bonded to the step portion, the third principal surface is lower than the second principal surfaces, the fourth principal surface is lower than the third principal surface, and the first principal surface of the sealing body is higher than the third principal surface of the step portion.

According to an embodiment, it is possible to improve a yield of a semiconductor device in a packing method for the semiconductor device.

DETAILED DESCRIPTION

The following embodiment will be described while being divided into a plurality of sections or embodiments, if necessary for the sake of convenience. However, unless otherwise specified, these are not independent of each other, but are in a relation such that one is a modified example, detailed description, complementary explanation, or the like of a portion or the whole of the other.

Further, in the following embodiment, when a reference is made to the number of elements and the like (including number, numerical value, quantity, range, and the like), the number of elements is not limited to the specific number, but may be equal to, greater than, or less than the specific number, unless otherwise specified, or except the case where the number is apparently limited to the specific number in principle, or except for other cases.

Furthermore, in the following embodiment, a constitutional element thereof (including an operation step or the like) is not always essential, unless otherwise specified, or except the case where it is apparently considered essential in principle, or except for other cases.

Similarly, in the following embodiment, when a reference is made to the shape, positional relationship, or the like of the constitutional elements or the like, it is understood that it includes one substantially analogous or similar to the shape or the like, unless otherwise specified, or unless otherwise considered apparently in principle, or except for other cases. This also applies to the aforementioned number and range.

Throughout the drawings for explaining the embodiment, the same members are labeled with the same reference sign in principle, and the redundant description is omitted. Further, hatching may be given even in a plan view for making the drawings easier to understand.

Embodiment

A packing method for a semiconductor device according to the present embodiment is described.

<Packing Method for Semiconductor Device>

Figure 1:
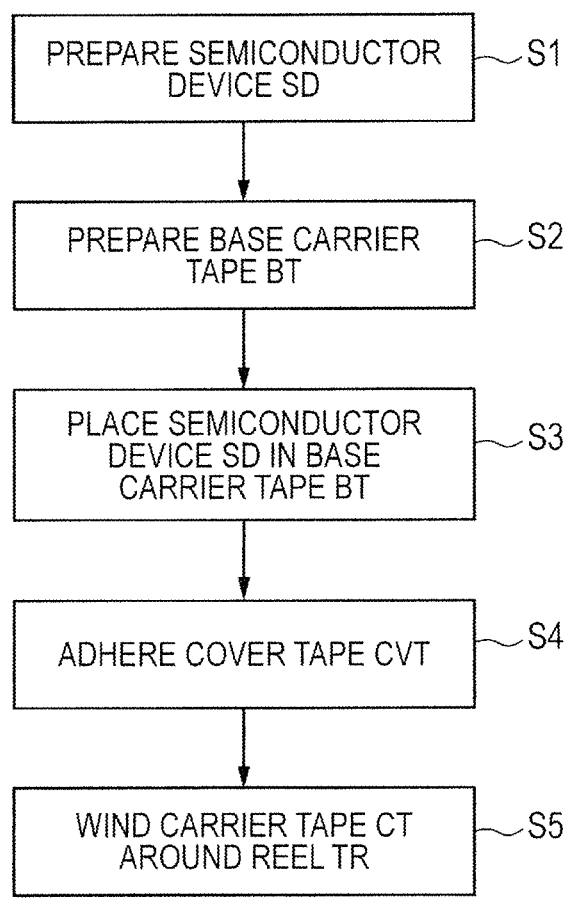
FIG. 1 illustrates a process flow of steps of packing a semiconductor device in an embodiment.
Figure 2:
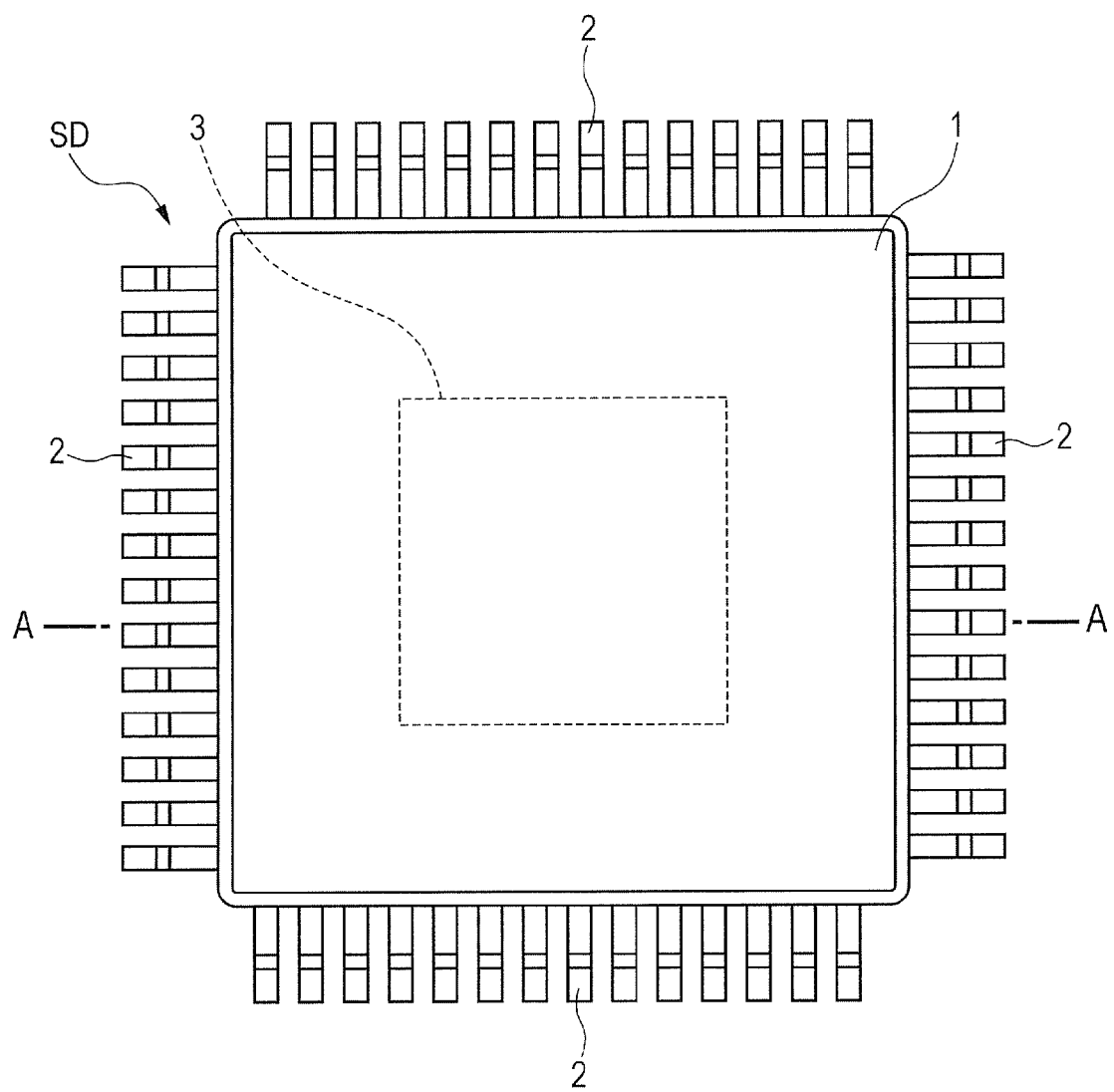
FIG. 2 is a plan view of the semiconductor device in the embodiment.
Figure 3:
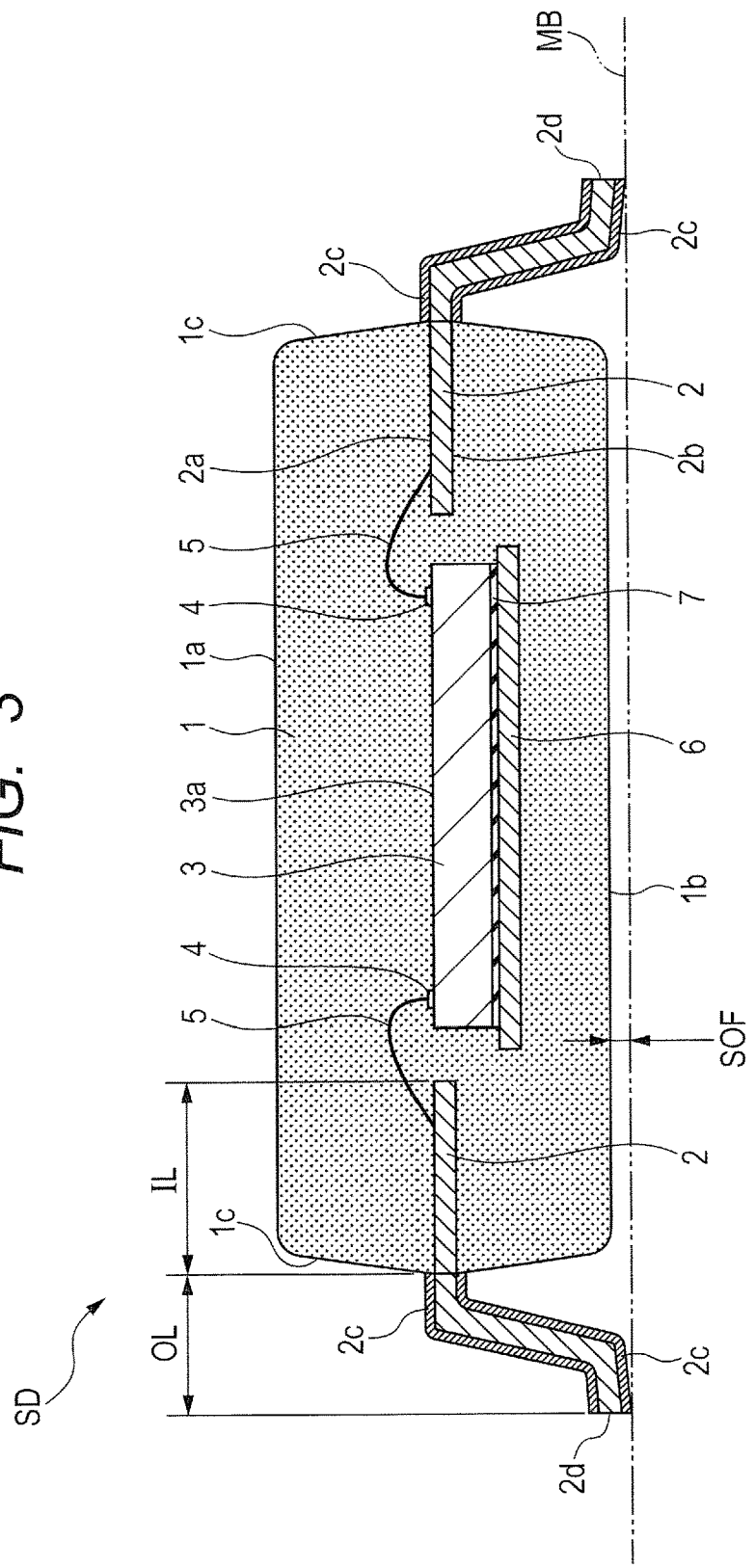
FIG. 3 is a cross-sectional view taken along line A-A in FIG. 2.
Figure 4:
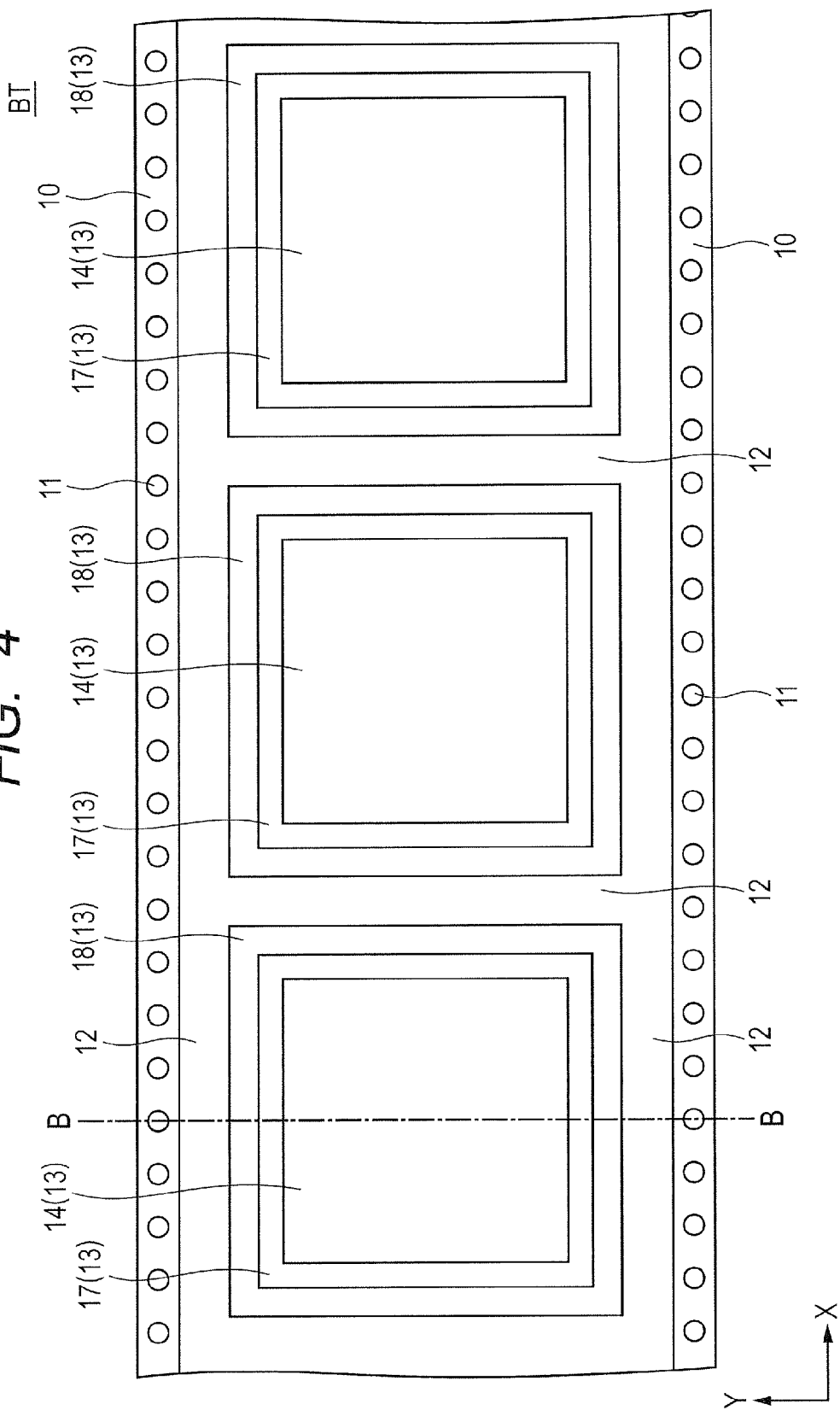
FIG. 4 is a plan view of a base carrier tape in the embodiment.
Figure 5:
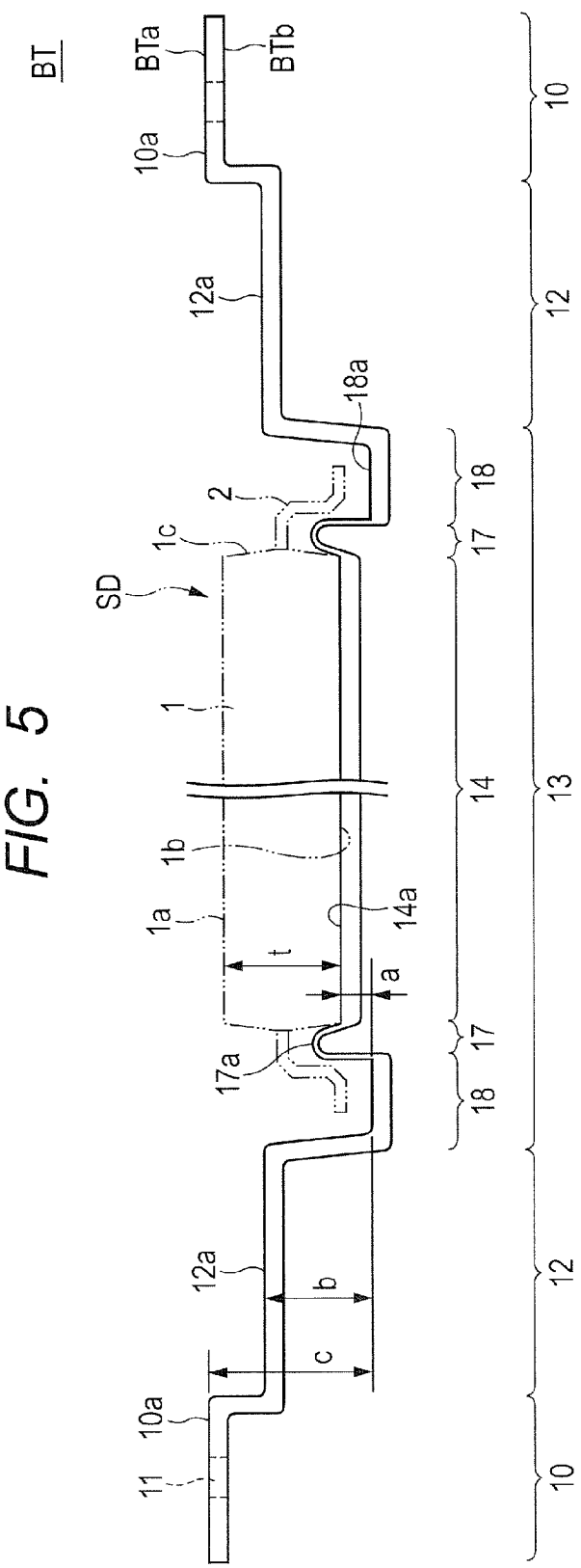
FIG. 5 is a cross-sectional view taken along line B-B in FIG. 4.
Figure 6:
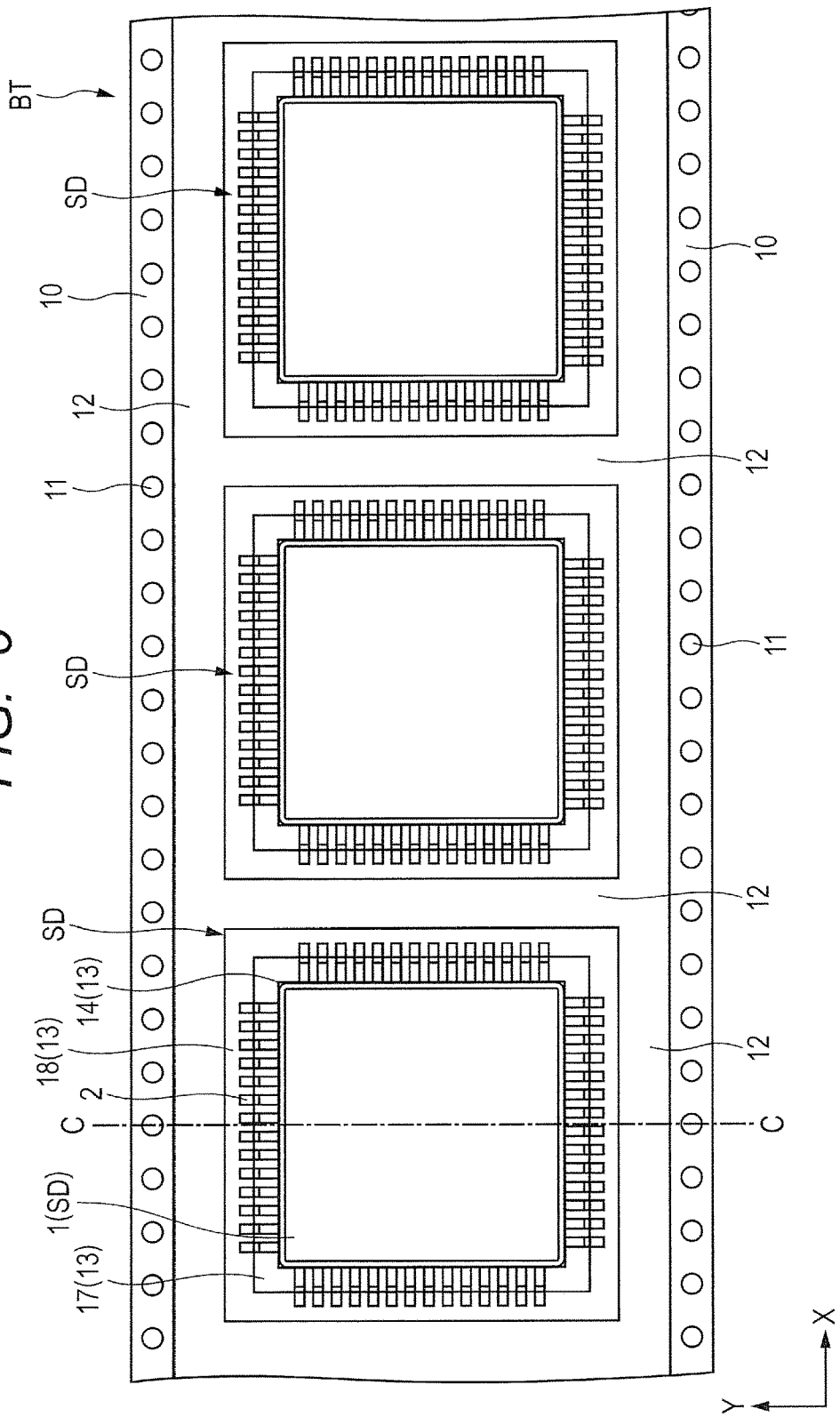
FIG. 6 is a plan view of the semiconductor device in the packing steps in the embodiment.
Figure 7:
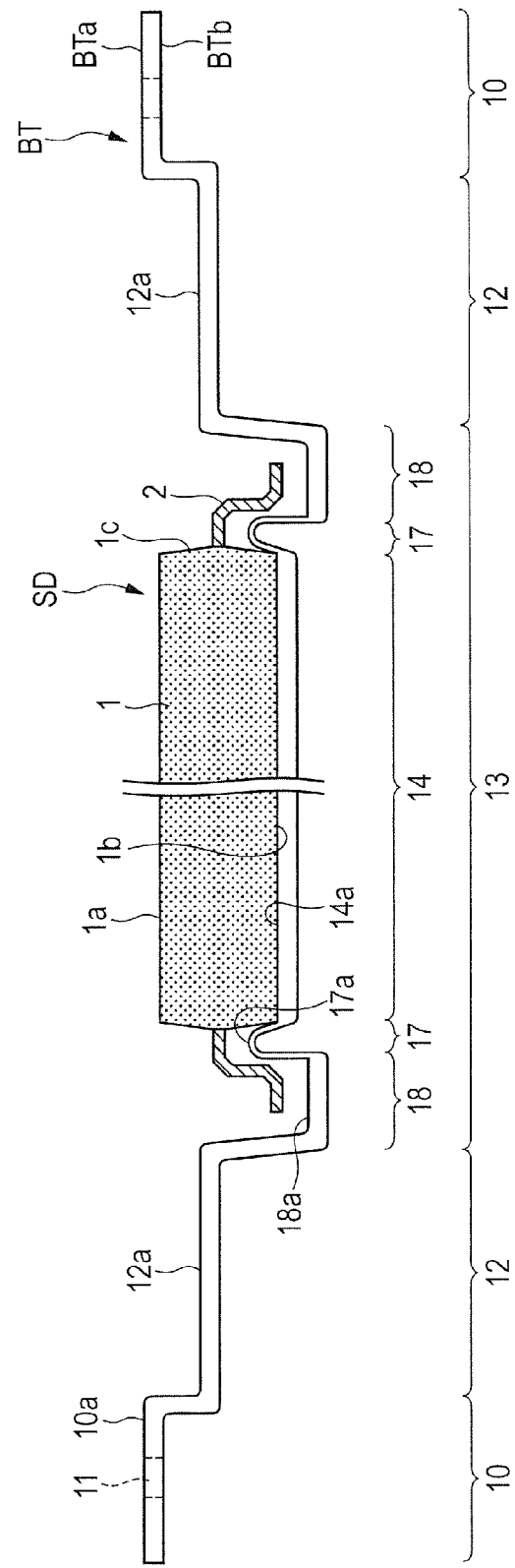
FIG. 7 is a cross-sectional view taken along line C-C in FIG. 6.
Figure 8:
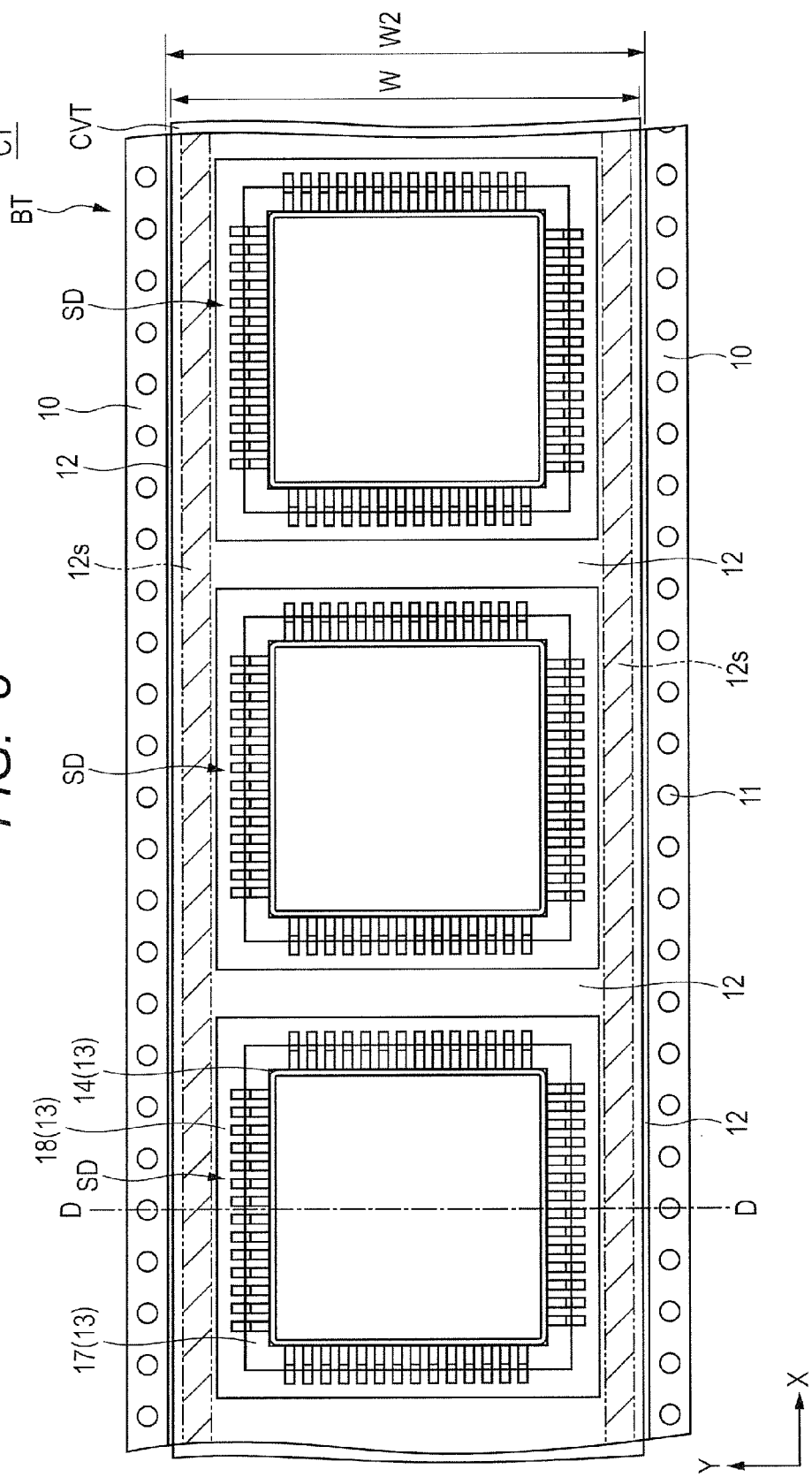
FIG. 8 is a plan view of the semiconductor device in the packing steps, following FIG. 6.
Figure 9:
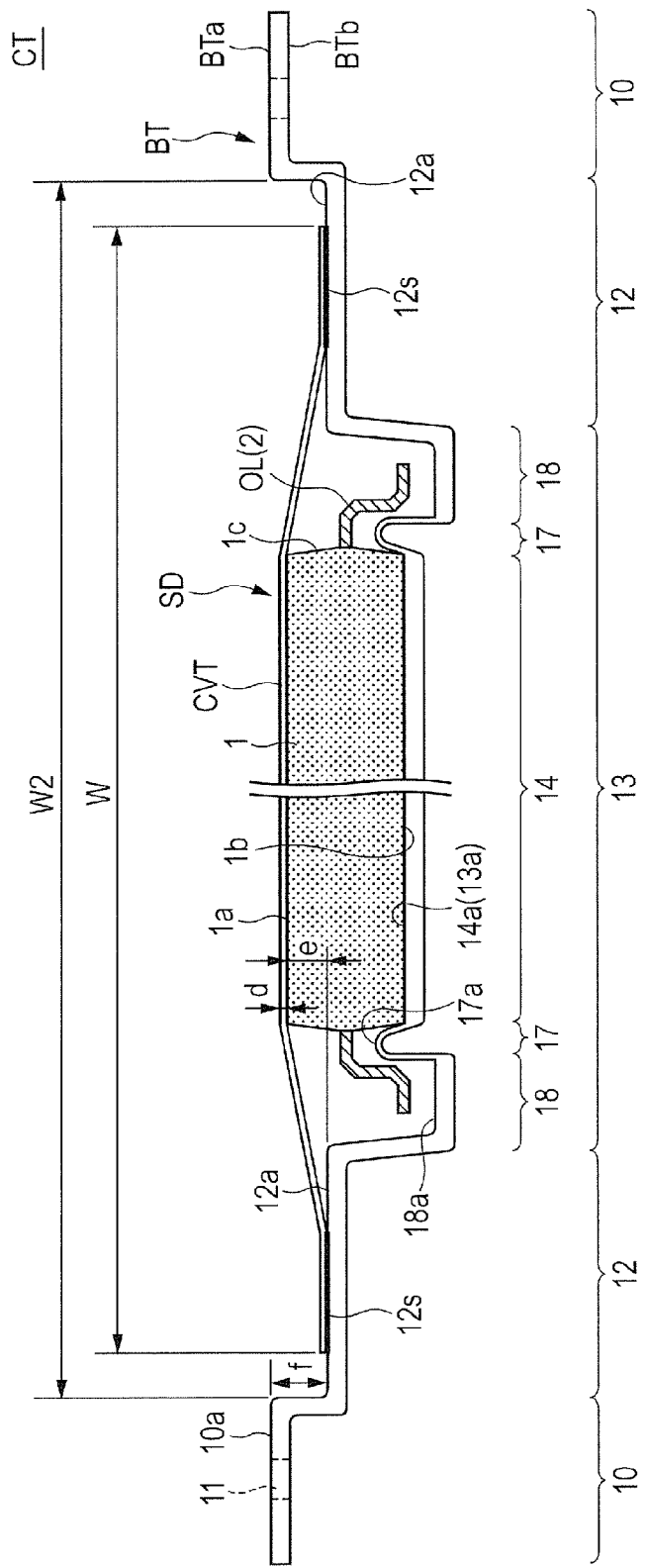
FIG. 9 is a cross-sectional view taken along line D-D in FIG. 8.
Figure 10:
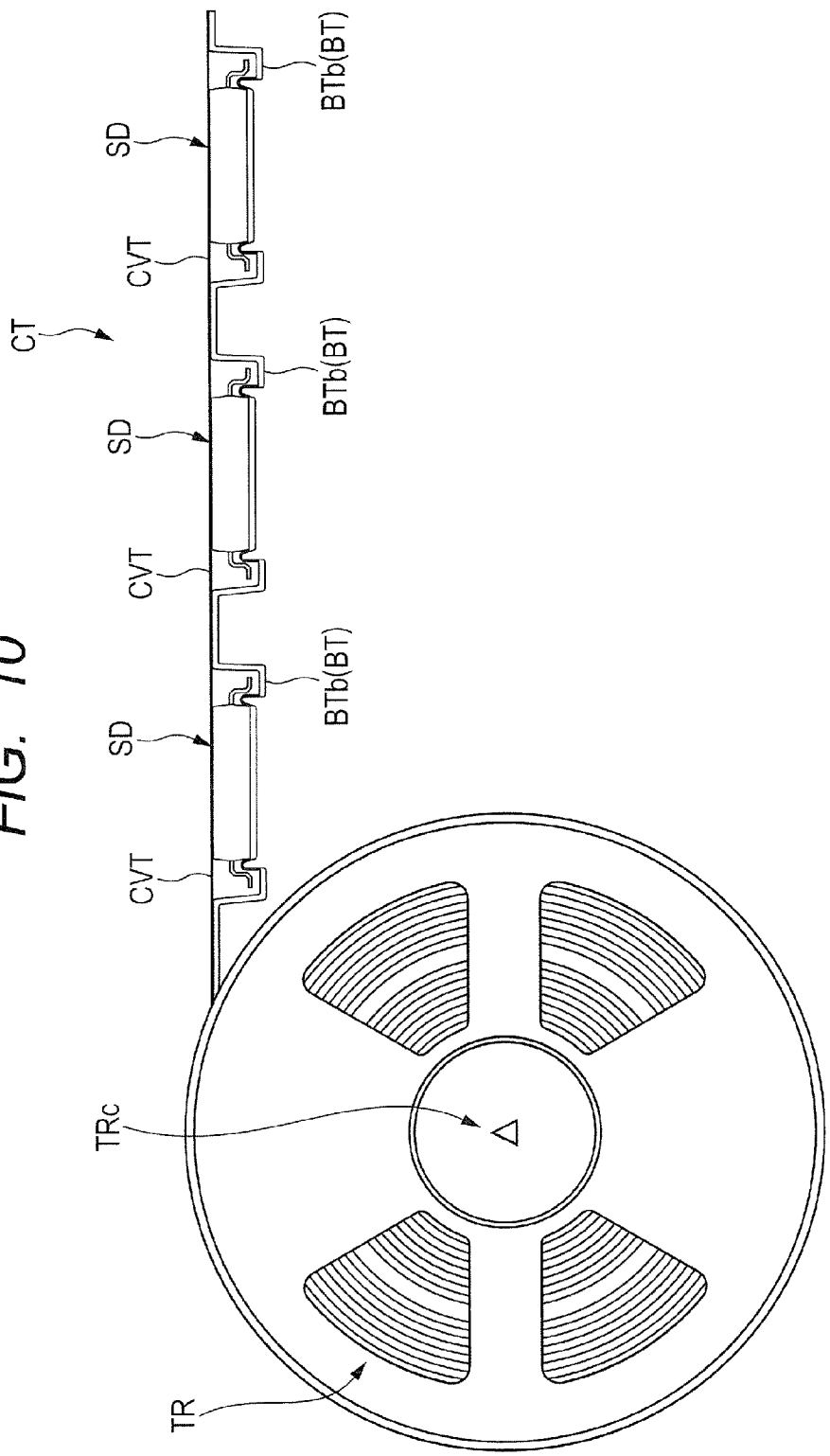
FIG. 10 is a side view of the semiconductor device in the packing steps, following FIG. 8.

FIG. 1 illustrates a process flow of steps of packing a semiconductor device in the present embodiment. FIG. 2 is a plan view of the semiconductor device in the present embodiment. FIG. 3 is a cross-sectional view taken along line A-A in FIG. 2. FIG. 4 is a plan view of a base carrier tape in the present embodiment. FIG. 5 is a cross-sectional view taken along line B-B in FIG. 4. FIG. 6 is a plan view of the semiconductor device in the packing steps in the present embodiment. FIG. 7 is a cross-sectional view taken along line C-C in FIG. 6. FIG. 8 is a plan view of the semiconductor device in the packing steps, following FIG. 6. FIG. 9 is a cross-sectional view taken along line D-D in FIG. 8. FIG. 10 is a side view of the semiconductor device in the packing steps, following FIG. 8.

A packing method for a semiconductor device according to the present embodiment is formed by steps illustrated in FIG. 1.

First, a step of "preparing a semiconductor device SD" (Step S1) in the process flow of FIG. 1 is performed. The configuration of the semiconductor device SD of the present embodiment is described referring to FIGS. 2 and 3.

The semiconductor device SD of the present embodiment includes an approximately rectangular sealing body 1 and a plurality of leads 2. The sealing body 1 has four sides, and the leads 2 project from the sealing body 1 to extend in a direction perpendicular to each side. A semiconductor chip 3 is arranged in a center portion of the sealing body 1. This semiconductor device SD is a surface mount semiconductor device called QFP.

FIG. 3 is a cross-sectional view taken along line A-A in FIG. 2. In FIG. 3, a mounting face MB of a mounting substrate on which the semiconductor device SD is mounted is illustrated with long dashed double-dotted line. The semiconductor device SD includes the semiconductor chip 3, the leads 2, and the sealing body 1.

The semiconductor chip 3 is formed by a semiconductor substrate made of silicon (Si), for example, and has a plurality of semiconductor elements, a plurality of wirings, and a plurality of terminals (an external electrode and an external leading electrode) 4. The semiconductor elements are MISFETs (Metal Insulator Semiconductor Field Effect Transistors), for example, and the wiring and the terminal 4 are formed of metal mainly containing aluminum (Al) or copper (Cu), for example. On a principal surface 3a of the semiconductor chip 3 are provided the semiconductor elements and the terminals 4. The semiconductor elements are mutually coupled by a plurality of wirings to form a circuit block which is electrically coupled to the terminal 4 by a wiring. The terminals 4 are electrically coupled to the leads 2. The terminal 4 is coupled to the lead 2 by a wire 5 mainly containing aluminum (Al) or copper (Cu), for example. In coupling of the terminal 4 and the lead 2 to each other, the wire 5 may be replaced with a gold (Au) bump, a solder bump, or the like.

The sealing body 1 covers the semiconductor chip 3, the wires 5, the leads 2, a die pad 6, and an adhesive layer 7. The semiconductor chip 3 is bonded to the die pad 6 by the adhesive layer 7. The sealing body 1 includes the principal surface (sealing-body principal surface) 1a that is flat, a rear surface (a sealing-body rear surface) 1b that is flat, and a side surface (a sealing-body side surface) 1c coupling the principal surface 1a and the rear surface 1b to each other. The principal surface (an upper surface, a surface) 1a and the rear surface (lower surface) 1b are parallel to the mounting face MB while the semiconductor device SD is mounted on the mounting face MB. Note that a side of the semiconductor substrate SD, which is closer to the mounting face MB, is defined as the rear surface (sealing-body rear surface) 1b and a side of the semiconductor substrate SD, which is farther from the mounting face MB, is defined as the principal surface (sealing-body principal surface) 1a, while the semiconductor device SD is mounted on the mounting substrate.

The leads 2 are arranged to surround the semiconductor chip 3 and radially extend from the semiconductor chip 3 as a center. The leads 2 are formed of copper (Cu) or 42 alloy as a base material. Each lead 2 has a principal surface (an upper a surface, surface, and a lead principal surface) 2a and a rear surface (a lower surface and a lead rear surface) 2b.

The lead 2 is formed by an inner lead portion IL located inside the sealing body 1 and an outer lead portion OL located outside the sealing body 1. The principal surface 2a and the rear surface 2b of the outer lead portion OL are covered by a solder plating film 2c. Although a side surface of the outer lead portion OL of the lead 2 is also covered by the solder plating film 2c, a portion that is not covered by the solder plating film 2c and in which the base material is exposed exists at a tip 2d of the outer lead portion OL. However, a surrounding portion of the base material at the tip 2d is covered by the solder plating film 2c. The wire 5 is coupled to the principal surface 2a of the inner lead portion IL of the lead 2. In a case of using the gold (Au) bump or the solder bump, the terminal 4 is coupled to the rear surface 2b of the lead 2.

The outer lead portion OL has a gullwing shape, and has a projecting portion that projects straight continuously from the inner lead portion IL to the outside of the sealing body 1, a bending portion that extends from the projecting portion toward the mounting face MB, and a coupling portion that extends from the bending portion approximately in parallel to the mounting face MB and is coupled to the mounting substrate via mounting solder. That is, the lead 2 projecting from the side surface 1c of the sealing body 1 is bent toward the rear surface 1b of the sealing body 1, and is then further bent toward a direction approximately parallel to the rear surface 1b of the sealing body 1.

Further, as illustrated in FIG. 3, the rear surface 1b of the sealing body 1 has a predetermined gap from the mounting face MB while the semiconductor substrate SD is mounted on the mounting face. This gap is called a standoff SOF. The standoff SOF is for ensuring coupling reliability when the semiconductor device SD is mounted on the mounting substrate, and should not have a negative value. That is, the rear surface 2b of the outer lead portion OL is located at a lower level than the rear surface 1b of the sealing body 1.

Next, a step of "preparing a base carrier tape BT" (Step S2) in the process flow of FIG. 1 is performed. Although an example where Step S1 is followed by Step S2 is described, Steps 2 may be followed by Step 1. The base carrier tape BT is described referring to a plan view in FIG. 4 and a cross-sectional view in FIG. 5. For convenience of description, the semiconductor device SD that is not mounted on the base carrier tape BT in this step is illustrated with long dashed double-dotted line.

The base carrier tape BT is formed of thermoplastic resin (e.g., polystyrene-based resin) having a film thickness of about 0.3 mm, and is a embossed structure in the form of a long tape. A lengthwise direction of the base carrier tape BT is defined as X-direction, and a widthwise direction thereof is defined as Y-direction, as illustrated in FIG. 4. The base carrier tape BT has two peripheral portions 10 that are respectively located at both ends in Y-direction, respectively, and extend in X-direction, a step portion 12 that is located between the two peripheral portions 10 in Y-direction and extends in X-direction, and a plurality of pocket portions (semiconductor-device placing portions) 13 that are formed in the step portion 12 and are arranged at regular intervals in X-direction. The step portion 12 is formed between the peripheral portion 10 and the pocket portion 13 and between adjacent pocket portions 13, and therefore completely surrounds each pocket portion 13.

The two peripheral portions 10 are provided with a plurality of holes 11 (sprocket holes) 11 extending through the base carrier tape BT formed therein. The holes 11 are arranged at regular intervals in X-direction.

The pocket portion 13 has an approximately rectangular sealing-body placing portion 14, an annular side-surface supporting portion 17 that surrounds the sealing-body placing portion 14, and an annular lead placing portion 18 that surrounds them. The sealing-body placing portion 14 can be formed to be square or rectangular in a plan view, and may have a shape of a rounded square or a rounded rectangle. It is preferable that the shape of the sealing-body placing portion 14 is the same as the planar shape of the sealing body 1 of the semiconductor device SD.

As illustrated in FIG. 5, the peripheral portion 10, the step portion 12, and the pocket portion 13 are formed by embossing the base carrier tape BT. Therefore, flat portions of the peripheral portion 10, the step portion 12, the lead placing portion 18, and the sealing-body placing portion 14 have approximately equal film thickness. Note that a surface on a side of the base carrier tape BT on which the semiconductor device SD is placed is defined as a principal surface BTa and the opposite surface is defined as a rear surface BTb. Although FIG. 5 is a cross-sectional view taken along line B-B in FIG. 4, the size of each portion does not always correspond to that in FIG. 4.

As illustrated in FIG. 5, the principal surface BTa of the base carrier tape BT has a principal surface 10a in the peripheral portion 10, a principal surface 12a in the step portion 12, a principal surface 18a in the lead placing portion 18, and a principal surface 14a in the sealing-body placing portion 14.

The sealing-body placing portion 14 is a region in which the sealing body 1 of the semiconductor device SD is placed, and the rear surface 1b of the sealing body 1 is in contact with the principal surface 14a of the sealing-body placing portion 14. The side-surface supporting portion 17 is in contact with the side surface 1c of the sealing body 1 at its sidewall, so that the side-surface portion 17 prevents planar displacement of the sealing body 1 (the semiconductor device SD). Because the sealing body 1 is supported by the principal surface 14a of the sealing-body placing portion 14 and the side-surface supporting portion 17 in this manner, the lead 2 cannot come into contact with the principal surface BTa of the base carrier tape BT and is spaced away from the base carrier tape BT. An apex 17a of the side-surface supporting portion 17 is also spaced away from the lead 2 and is not in contact with the lead 2. However, the apex 17a of the side-surface supporting portion 17 is smaller than ½ of the thickness of the sealing body 1 so that it does not come into contact with the lead 2. Therefore, when the pocket portion 13 is warped to be convex, as described before, the rear surface 1b of the sealing body 1 goes beyond the apex 17a of the side-surface supporting body 17, so that the semiconductor device SD is displaced.

As illustrated in FIG. 5, the principal surface 14a of the sealing-body placing portion 14 is arranged to be higher than the principal surface 18a of the lead placing portion 18 as a reference by a distance a. This results from the aforementioned standoff SOF. This is because, in a case where the principal surface 14a of the sealing-body placing portion 14 is arranged at the same level as the principal surface 18a of the lead placing portion 18, the lead 2 comes into contact with the principal surface 14a of the sealing-body placing portion 14 to be deformed. Therefore, it is preferable that the distance a be larger than the amount of standoff SOF.

The principal surface 12a of the step portion 12 is higher than the principal surface 18a of the lead placing portion 18 by a distance b (b>a). However, it is important that the principal surface 12a of the step portion 12 is lower than the principal surface 1a of the sealing body 1. This is represented by the following expression, assuming that the thickness of the sealing body 1 is t.

$$b < t + a \quad \text{(Expression 1)}$$

By satisfying Expression 1, it is possible to press the sealing body 1 of the semiconductor device SD against the base carrier tape BT by a cover tape CVT adhering to the step portion 12 as described later, so that displacement of the semiconductor device SD can be prevented.

Further, the principal surface 10a of the peripheral portion 10 is higher than the principal surface 18a of the lead placing portion 18 by a distance c. It is important that the principal surface 10a is higher than the principal surface 12a (c>b), and it is preferable to satisfy the following expression 2.

$$c \geq t + a \quad \text{(Expression 2)}$$

By satisfying Expression 1 and Expression 2, it is possible to increase the number of winding when a carrier tape CT is wound around a tape reel TR (that is, the number of semiconductor devices) while preventing displacement of the semiconductor device SD, as described later.

That is, it is important to satisfy the following expression 3 in such a manner that the principal surface 1a of the semiconductor device SD is located between the principal surface 12a of the step portion 12 and the principal surface 10a of the peripheral portion at a stage (state) before the base carrier tape BT is wound around the tape reel TR, which will be described later.

$$b < t + a \leq c \quad \text{(Expression 3)}$$

Next, a step of "placing the semiconductor device SD in the base carrier tape BT" (Step S3) in the process flow of FIG. 1 is performed.

As illustrated in FIGS. 6 and 7, the semiconductor device SD is placed in the pocket portion 13 of the base carrier tape BT. The sealing body 1 of the semiconductor device SD is placed in the sealing-body placing portion 14 of the base carrier tape BT. That is, the rear surface 1b of the sealing body 1 is brought into contact with the principal surface 14a of the sealing-body placing portion 14.

Next, a step of "adhering a cover tape CVT" (Step S4) in the process flow of FIG. 1 is performed. The cover tape CVT is bonded to the base carrier tape BT to cover the semiconductor device SD, thereby forming a carrier tape CT.

As illustrated in FIGS. 8 and 9, the cover tape CVT in the form of a band shape is bonded to the step portion 12 of the base carrier tape BT to cover a plurality of semiconductor devices SD and a plurality of pocket portions 13 of the base carrier tape BT. In the present embodiment, the cover tape CVT has a narrower width W in Y-direction than the width W2 of the step portion 12, and does not reach the peripheral portion 10. Therefore, the cover tape CVT covers the step portion 12, but does not cover the peripheral portion 10, that is, the peripheral portion 10 is exposed. The width W in Y-direction of the cover tape CVT may be larger than the width W2 of the step portion 12, as long as the cover tape CVT does not cover the holes 11.

The cover tape CVT is a polyethylene-based resin film having a thickness of about 50 μm, for example, and is bonded to the step portion 12 of the base carrier tape BT by thermocompression bonding, for example. A bonding portion (bonding area) 12s is located between the peripheral portion 10 and the pocket portion 13, and extends in X-direction, as illustrated in FIG. 8. The bonding portions 12s are formed on both sides of the pocket portion 13 in Y-direction, respectively. No bonding portion 12s is formed between the pocket portions 13.

JIS C0806-3:2014 specifies in 7f on page 20 that "a top surface cover tape should not be bonded to a surface between adjacent two part-placing portions of a carrier tape", which is satisfied by the bonding portion 12s of the present embodiment.

As illustrated in FIG. 9, the principal surface 1a of the sealing body 1 is higher than the principal surface 12a of the step portion 12 by a distance e, and unlike Patent Literature 1 described before, the cover tape CVT bonded to the principal surface 12a of the step portion 12 is formed by a resin film in the form of a single sheet and is in contact with the principal surface 1a of the sealing body 1. Because the cover tape CVT that is elastic is bonded while being extended in Y-direction in FIG. 8, the cover tape CVT presses the sealing body 1 against the base carrier tape BT by its shrinking force. Therefore, it is possible to prevent the semiconductor device SD from being displaced or falling out from the pocket portion 13. That is, in order to prevent the semiconductor device SD from being displaced or falling out from the pocket portion 13, it is important that the principal surface 1a of the sealing body 1 is higher than the principal surface 12a of the step portion 12 of the base carrier tape BT (this can be represented as e>0).

Further, when a step between the principal surface 12a of the step portion 12 of the base carrier tape BT and the principal surface 10a of the peripheral portion 10 is defined as a distance f, it is preferable that the principal surface 1a of the sealing body 1 is located within a range of this step (this can be represented as e≤f). That is, the principal surface 1a of the sealing body 1 is arranged between the principal surface 10a of the peripheral portion 10 of the base carrier tape BT and the principal surface 12a of the step portion 12 (this can be represented as 0<e≤f and corresponds to the aforementioned Expression 3).

Furthermore, it is more preferable that the top surface of the cover tape CVT located on the principal surface 1a of the sealing body 1 is located within this range of the step (this can be represented as e+d≤f).

As described above, it is possible to reduce the thickness of the carrier tape CT by arranging the principal surface 1a of the sealing body 1 or the top surface of the cover tape CVT located on the principal surface 1a of the sealing body 1 at an equal level to or a lower level than the principal surface 10a of the peripheral portion 10 of the base carrier tape BT.

Next, a step of "winding the carrier tape CT around the tape reel TR" (Step S5) in the process flow of FIG. 1 is performed.

As illustrated in FIG. 10, the carrier tape CT is wound around a core TRc that is circular in a side view. This winding is performed in such a manner that the rear surface BTb of the base carrier tape BT is located on the core TRc side and the cover tape CVT is located on the outer side. FIG. 10 schematically illustrates the base carrier tape BT, the semiconductor device SD, and the cover tape CVT.

As the carrier tape CT gets closer to the core TRc, the radius of curvature of the carrier tape CT becomes smaller, and the aforementioned convex warp can occur more easily and the degree of the convex warp becomes larger. Therefore, the carrier tape CT with no semiconductor device SD placed therein may be wound around the core TRc, first. This is called "empty-winding".

<Features and Advantageous Effects of Packing Method for Semiconductor Device of the Present Embodiment>

The carrier tape CT is configured in such a manner that the step portion 12 is provided in the base carrier tape BT, the principal surface 1a of the sealing body 1 of the semiconductor device SD placed in the pocket portion 13 of the base carrier tape BT is arranged to be higher than the principal surface 12a of the step portion 12, and the principal surface 1a of the sealing body 1 of the semiconductor device SD is pressed against the base carrier tape BT by the cover tape CVT bonded to the principal surface 12a of the step portion 12. Even when this carrier tape CT is wound around the tape reel TR and is shipped and carried, it is possible to prevent the semiconductor device SD from being displaced or falling out, so that deformation of the lead 2 of the semiconductor device SD can be prevented. That is, because the sealing body 1 is pressed against the base carrier tape BT in a state before the carrier tape CT is wound around the tape reel TR, it is possible to prevent the semiconductor device SD from being displaced or falling out even when the aforementioned convex warp occurs in a state where the carrier tape CT is wound around the tape reel TR.

Even when the aforementioned convex warp occurs and the sealing body 1 of the semiconductor device SD is pressed outward (that is, toward the cover tape CVT) in the state where the carrier tape CT is wound around the tape reel TR, a shrinking force of the cover tape CVT is increased correspondingly. Therefore, a pressing force acting on the sealing body 1 is also increased, so that it is possible to prevent the semiconductor device SD from being displaced or falling out.

Further, because the sealing body 1 is pressed against the base carrier tape BT by the cover tape CVT in the state before the carrier tape CT is wound around the tape reel TR, a structure that is strong against the aforementioned convex warp is achieved. Therefore, the amount of empty-winding can be reduced, so that shipment and conveyance of a larger number of semiconductor devices are possible.

In the state before the carrier tape CT is wound around the tape reel TR, the principal surface 1a of the sealing body 1 is arranged between the principal surface 10a of the peripheral portion 10 of the base carrier tape BT and the principal surface 12a of the step portion 12, or the top surface of the cover tape CVT is arranged at an equal level to or a lower level than the principal surface 10a of the peripheral portion 10 of the base carrier tape BT. With this configuration, the thickness of the carrier tape CT can be reduced, and the length of the carrier tape CT to be wound around the tape reel TR can be increased. Therefore, a large number of semiconductor devices can be shipped and carried.

Further, because the film thickness d of the cover tape CT is made thinner than the step (the distance f) between the principal surface 12a of the step portion 12 of the base carrier tape BT and the principal surface 10a of the peripheral portion 10, the thickness of the carrier tape CT can be reduced.

The carrier tape CT is configured in such a manner that the step portion 12 is provided in the base carrier tape BT, the principal surface 1a of the sealing body 1 of the semiconductor device SD placed in the pocket portion 13 of the base carrier tape BT is arranged to be higher than the principal surface 12a of the step portion 12, and the principal surface 1a of the sealing body 1 of the semiconductor device SD is pressed against the base carrier tape BT by the cover tape CVT bonded to the principal surface 12a of the step portion 12. That is, a structure is employed in which, in the state before the carrier tape CT is wound around the tape reel TR, in a cross-sectional view along in Y-direction, the principal surface 13a of the pocket portion 13 and the rear surface 1b of the sealing body 1 are in contact with each other, the principal surface 12a of the step portion 12 is located between the principal surface 10a of the peripheral portion 10 and the principal surface 13a of the pocket portion 13, and the height from the principal surface 13a of the pocket portion 13 to the principal surface 1a of the sealing body 1 is higher than the height from the principal surface 13a of the pocket portion 13 to the principal surface 12a of the step portion 12. Therefore, because the sealing body 1 is pressed against the base carrier tape BT, it is possible to prevent the semiconductor device SD from being displaced or falling out, even when the aforementioned convex warp occurs in the state where the carrier tape CT is wound around the tape reel TR.

Further, a structure is employed in which, in the state before the carrier tape CT is wound around the tape reel TR, the height from the principal surface 13a of the pocket portion 13 to the principal surface 1a of the sealing body 1 is equal to or lower than the principal surface 13a of the pocket portion 13 to the principal surface 10a of the peripheral portion 10 in the cross-sectional view along Y-direction. Therefore, the thickness of the carrier tape CT can be reduced, and the length of the carrier tape CT to be wound around the tape reel TR can be increased. Accordingly, shipment and conveyance of a large number of semiconductor devices are possible.

In addition, a structure is employed in which, in the state before the carrier tape CT is wound around the tape reel TR, in the cross-sectional view along Y-direction, the cover tape CVT has a first surface that is in contact with the principal surface 1a of the sealing body 1 and a second surface opposite to the first surface, and the height from the principal surface 13a of the pocket portion 13 to the second surface of the cover tape CVT located on the sealing body 1 is equal to or lower than the height from the principal surface 13a of the pocket portion 13 to the principal surface 10a of the peripheral portion 10. Therefore, the thickness of the carrier tape CT can be reduced.

Note that a "height" from a principal surface A to a principal surface B means a "distance" or a "gap" from the principal surface A to the principal surface B.

Modifications

In the above description, the invention made by the inventors of the present application has been specifically described by way of the embodiment. However, the present invention is not limited to the aforementioned embodiment, and can be changed in various ways within the scope not departing from the gist thereof. Although a plurality of modifications are described below, the modifications can be also put into practice by being combined as appropriate.

First Modification

A first modification is directed to the semiconductor device SD of the above embodiment.

Figure 11:
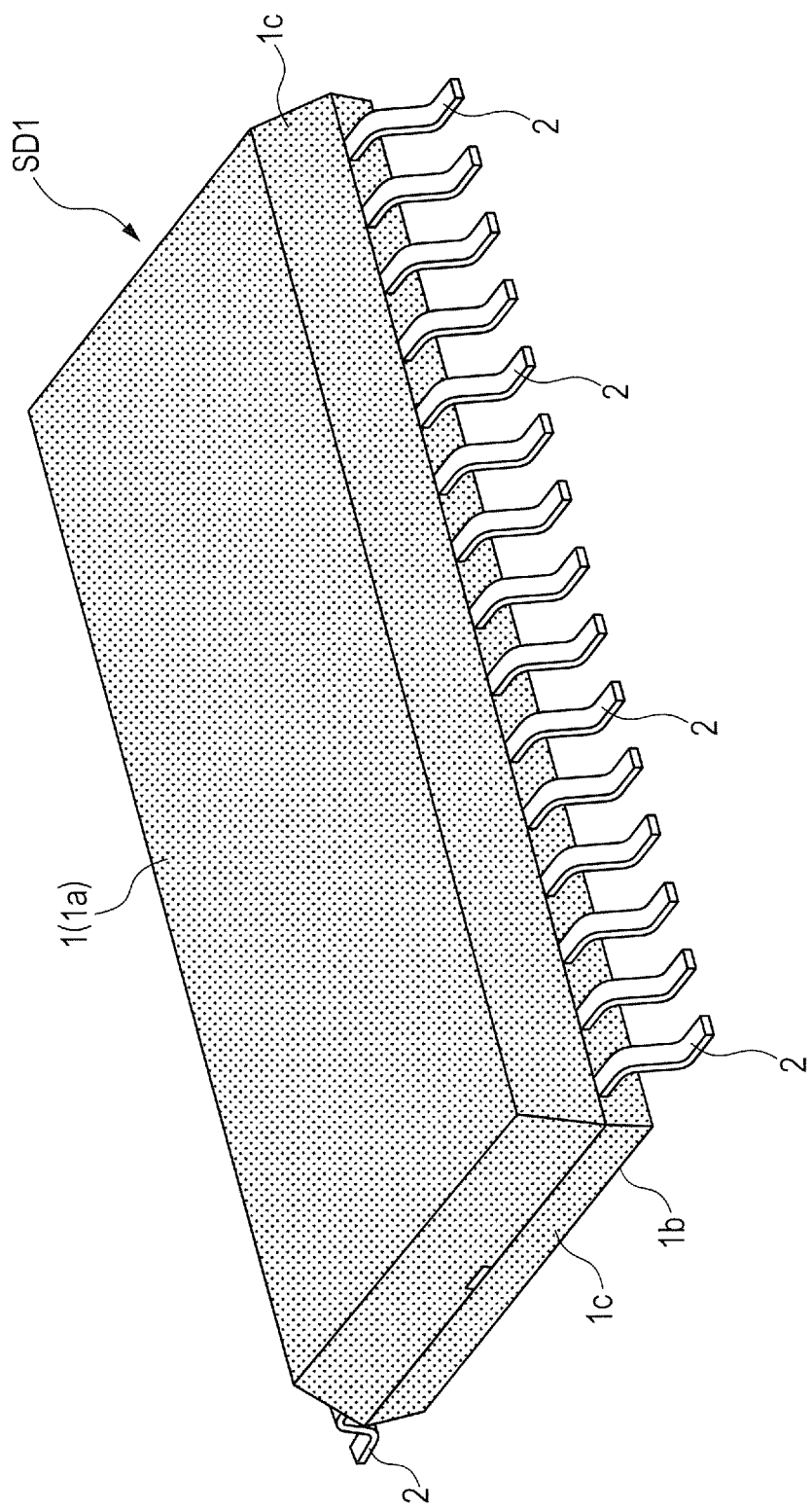
FIG. 11 is a perspective view of a semiconductor device in a first modification.

FIG. 11 is a perspective view of a semiconductor device in the first modification, and corresponds to FIG. 2. That is, although the semiconductor device SD in the above embodiment is QFP, a surface mount semiconductor device SD1 illustrated in FIG. 11, called SOP, can be also used. The semiconductor device SD1 has the sealing body 1 and the leads 2. The sealing body 1 in the form of an approximately cuboid has the approximately rectangular principal surface 1a, the rear surface 1b opposite to the principal surface 1a, and the side surfaces 1c coupling the principal surface 1a and the rear surface 1b to each other. The leads 2 project from each of two side surfaces 1c opposed to each other. The leads 2 located outside the sealing body 1 are gullwing, as in the above embodiment.

Second Modification

A second modification is directed to the bonding portion 12s of the above embodiment.

Figure 12:
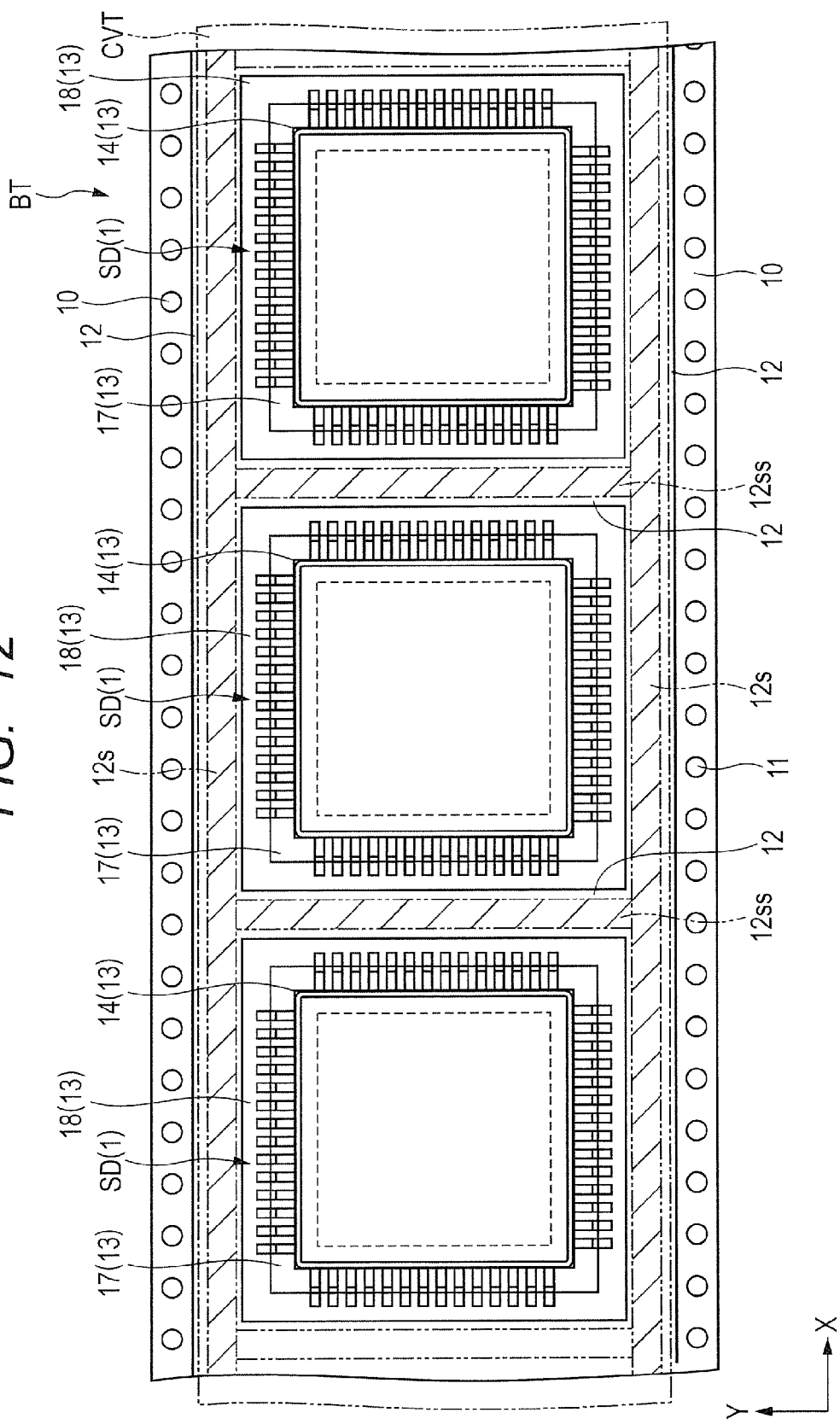
FIG. 12 is a plan view of a semiconductor device in packing steps in a second modification.

FIG. 12 is a plan view during packing steps for a semiconductor device in the second modification, and corresponds to FIG. 8. As illustrated in FIG. 12, a bonding portion (bonding region) 12ss is added to the configuration of FIG. 8. The cover tape CVT is bonded to the base carrier tape BT in the bonding portions 12s and 12ss. The bonding portion 12ss is formed in the step portion 12 between adjacent pocket portions 13, extends in Y-direction, and is coupled to the bonding portion 12s extending in X-direction. That is, each pocket portion 13 of the base carrier tape BT is surrounded (over its entire circumference) by the bonding portions 12s and 12ss.

With this configuration, it is possible to press the sealing body 1 of the semiconductor device SD against the base carrier tape BT more strongly, so that the semiconductor device SD can be prevented from being displaced or falling out.

Third Modification

A third modification is directed to the semiconductor device SD and the base carrier tape BT of the above embodiment.

Figure 13:
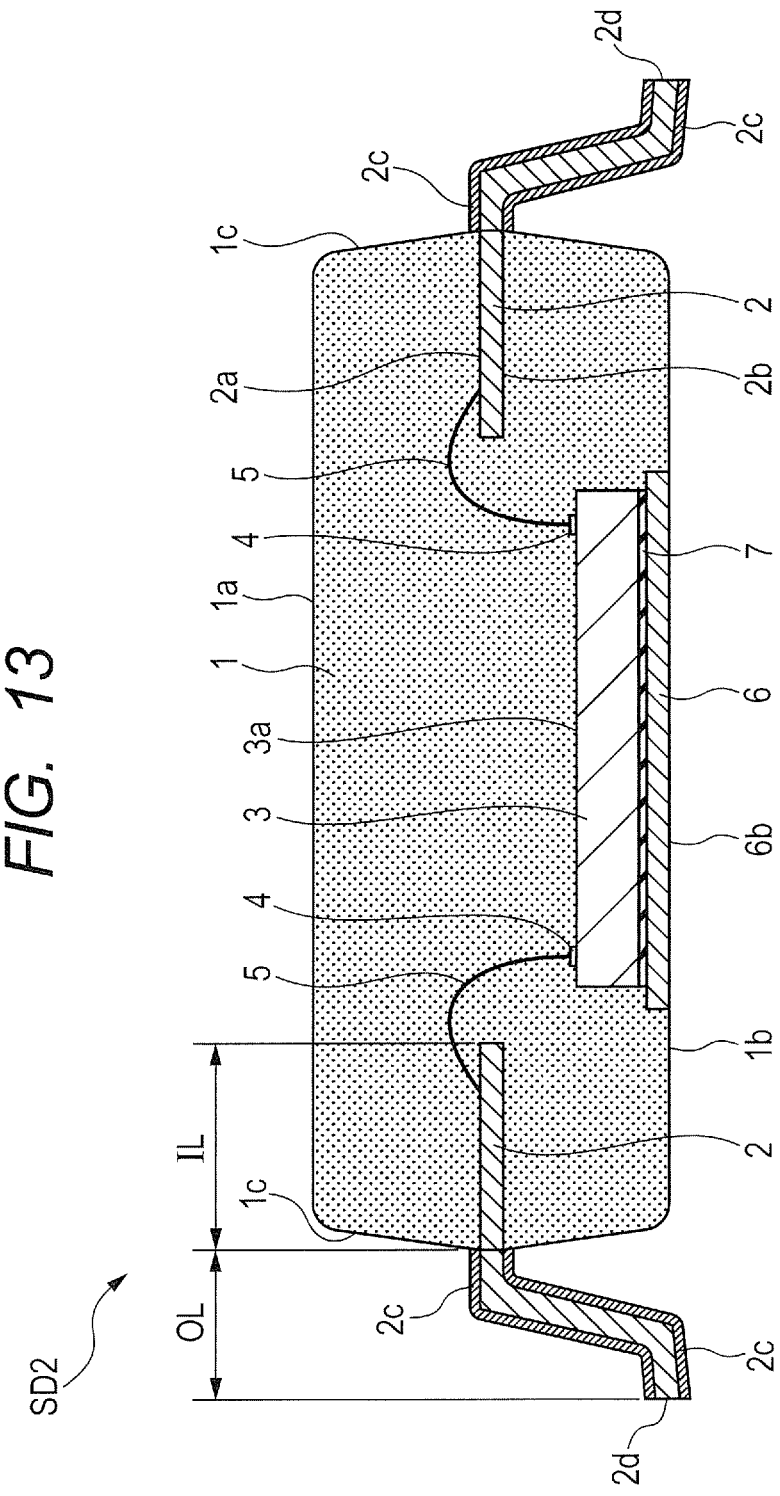
FIG. 13 is a cross-sectional view of a semiconductor device in a third modification.
Figure 14:
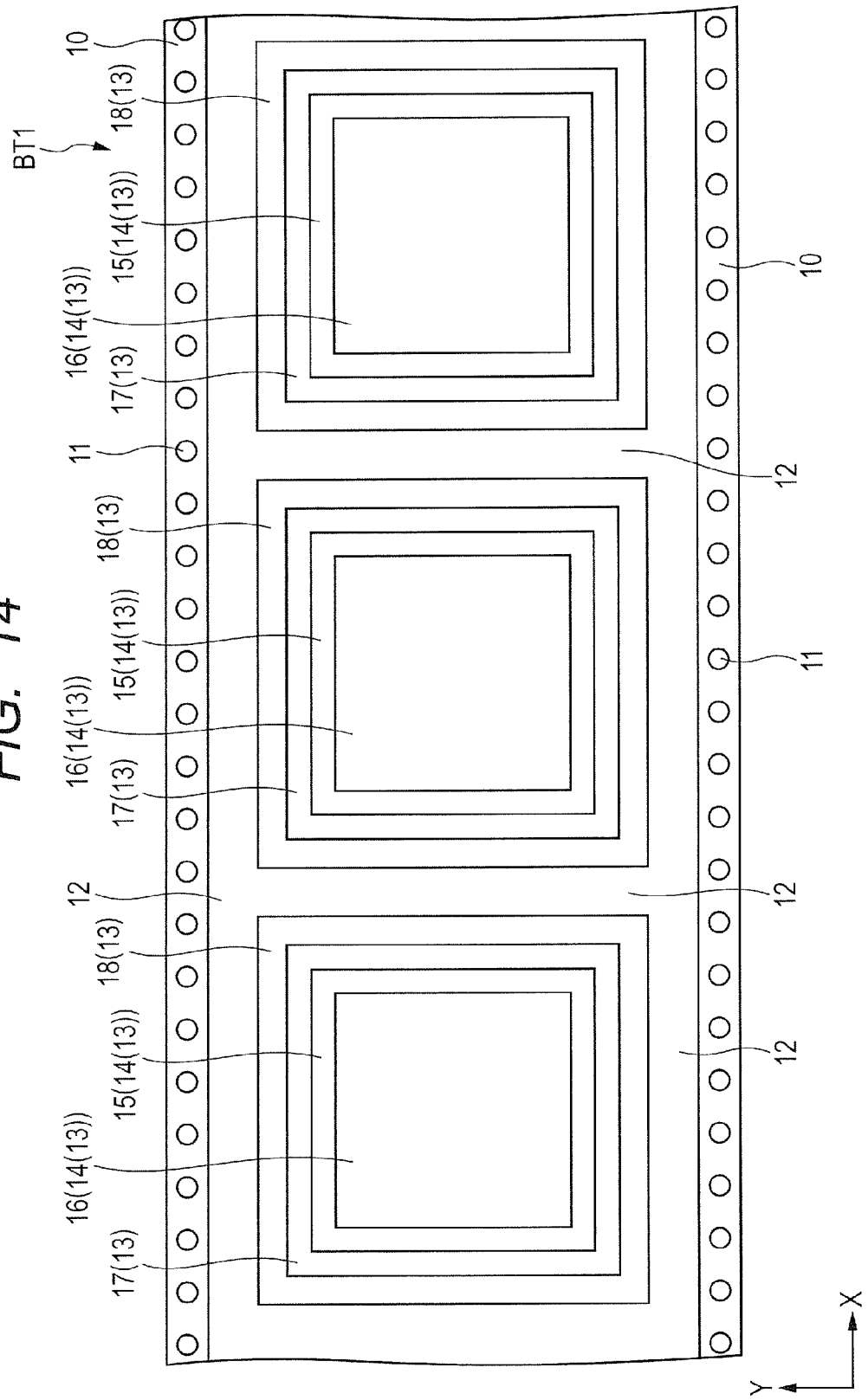
FIG. 14 is a plan view of a base carrier tape in the third modification.
Figure 15:
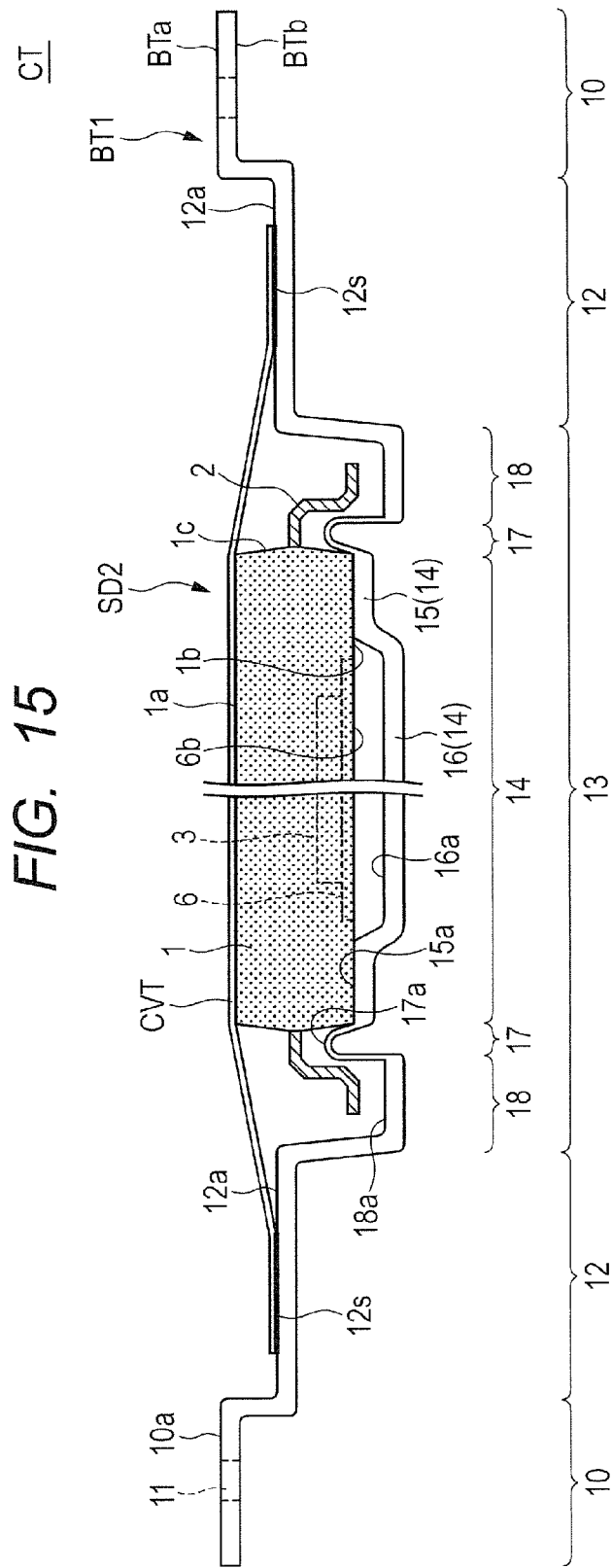
FIG. 15 is a cross-sectional view of the semiconductor device in packing steps in the third modification.

FIG. 13 is a cross-sectional view of a semiconductor device in the third modification, and corresponds to FIG. 3. FIG. 14 is a plan view of a base carrier tape BT1 in the third modification, and corresponds to FIG. 4. FIG. 15 is a plan view during packing steps for a semiconductor device in the third modification, and corresponds to FIG. 9. That is, in a case of a semiconductor device SD2 illustrated in FIG. 13, it is preferable to use the base carrier tape BT1 illustrated in FIG. 14, and a state in that case where the semiconductor device SD2 is packed by using the base carrier tape BT1 and the cover tape CVT is illustrated in FIG. 15.

In the third modification, the semiconductor device SD2 is used, in which a rear surface 6b of the die pad 6 is exposed from the rear surface 1b of the sealing body 1, as illustrated in FIG. 13. By exposing the rear surface 6b of the die pad 6 from the rear surface 1b of the sealing body 1, it is possible to obtain an advantageous effect of radiating heat generated from the semiconductor chip 3 to the outside of the semiconductor device SD2. Therefore, when the semiconductor device SD2 is mounted on a mounting substrate, the rear surface 6b of the die pad 6 is soldered to a metal wiring of the mounting substrate.

In the base carrier tape BT1 illustrated in FIG. 14, the sealing-body placing portion 14 that is a portion of the pocket portion 13 has a rear-surface supporting portion 15 and a dent portion 16, unlike the above embodiment. The rear-surface supporting portion 15 is formed annularly inside the side-surface supporting portion 17 that is a portion of the pocket portion 13, and the dent portion 16 is formed inside the rear-surface supporting portion 15. An outer shape of the dent portion 16 is larger (that is, wider) than the rear surface 6b of the die pad 6 exposed from the rear surface 1b of the sealing body 1 of the semiconductor device SD2, so that a configuration in which the rear surface 6b of the die pad 6 is not in contact with the base carrier tape BT1 is achieved, as described later.

As illustrated in FIG. 15, the semiconductor device SD2 is placed in the pocket portion 13 of the base carrier tape BT1, and the rear surface 1b of the sealing body 1 is in contact with a principal surface 15a of the rear-surface supporting portion 15 of the sealing-body placing portion 14. That is, the sealing body 1 (in other words, the semiconductor device SD2) is supported by the base carrier tape BT1 in the rear-surface supporting portion 15.

A space is formed between a principal surface 16a of the dent portion 16 that is a portion of the sealing-body placing portion 14 and the rear surface 6b of the die pad 6 exposed from the rear surface 1b of the sealing body 1, and the rear surface 6b of the die pad 6 is not in contact with the principal surface 16a of the dent portion 16. The dent portion 16 is wider than the die pad 6, as illustrated in FIG. 15. Although FIG. 15 illustrates a cross-section taken along Y-direction in FIG. 14, the dent portion 16 is wider than the die pad 6 also in a cross-section taken along X-direction. With this configuration, even when a very small foreign particle enters into the dent portion 16, for example, it is possible to reduce or prevent adherence of the foreign particle to the rear surface 6b of the die pad 6. Thus, it is possible to reduce or prevent a failure of soldering of the rear surface 6b of the die pad 6 caused by this foreign particle, when the semiconductor device SD2 is mounted on the mounting substrate.

Further, the principal surface 16a of the dent portion 16 is surrounded by the principal surface 15a of the rear-surface supporting portion 15. In the state before the carrier tape CT is wound around the tape reel TR, in a cross-sectional view taken along Y-direction, the principal surface 12a of the step portion 12 is located between the principal surface 10a of the peripheral portion 10 and the principal surface 15a of the rear-surface supporting portion 15, the height from the principal surface 15a of the rear-surface supporting portion 15 to the principal surface 12a of the step portion 12 is lower than the height from the principal surface 15a of the rear-surface supporting portion 15 to the principal surface 10a of the peripheral portion 10, the height from the principal surface 16a of the dent portion 16 to the principal surface 15a of the rear-surface supporting portion 15 is lower than the height from the principal surface 16a of the dent portion 16 to the principal surface 12a of the step portion 12, and the height from the principal surface 15a of the rear-surface supporting portion 15 to the principal surface 1a of the sealing body 1 is lower than the height from the principal surface 15a of the rear-surface supporting portion 15 to the principal surface 12a of the step portion 12. Therefore, because the sealing body 1 is pressed against the base carrier tape BT1, it is possible to prevent the semiconductor device SD2 from being displaced or falling out even when the aforementioned convex warp occurs in the state where the carrier tape CT is wound around the tape reel TR.

Furthermore, in the state before the carrier tape CT is wound around the tape reel TR, in the cross-sectional view taken along Y-direction, the height from the principal surface 15a of the rear-surface supporting portion 15 to the principal surface 1a of the sealing body 1 is equal to or lower than the height from the principal surface 15a of the rear-surface supporting portion 15 to the principal surface 10a of the peripheral portion 10. Therefore, the thickness of the carrier tape CT can be reduced, and the length of the carrier tape CT to be wound around the tape reel TR can be increased. Accordingly, it is possible to ship and carry a large number of semiconductor devices.

In addition, in the state before the carrier tape CT is wound around the tape reel TR, in the cross-sectional view taken along Y-direction, the cover tape CVT has a first surface that is in contact with the principal surface 1a of the sealing body 1 and a second surface opposite to the first surface, and the height from the principal surface 15a of the rear-surface supporting portion 15 to the second surface of the cover tape CVT located on the sealing body 1 is equal to or lower than the height from the principal surface 15a of the rear-surface supporting portion 15 to the principal surface 10a of the peripheral portion 10. Therefore, the thickness of the carrier tape CT can be reduced.

Fourth Modification

A fourth modification is directed to the base carrier tape BT of the above embodiment.

Figure 16:
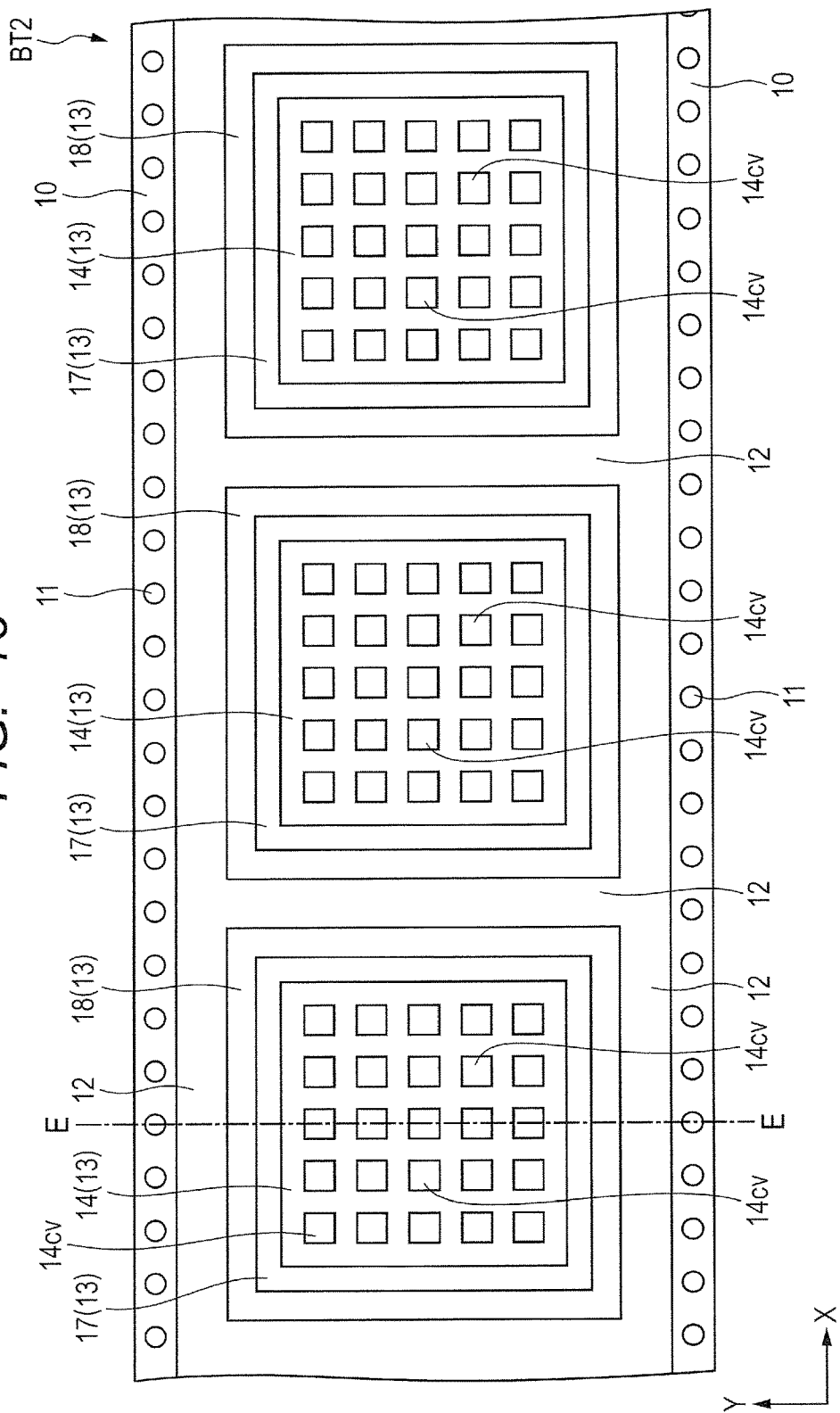
FIG. 16 is a plan view of a base carrier tape in a fourth modification.
Figure 17:
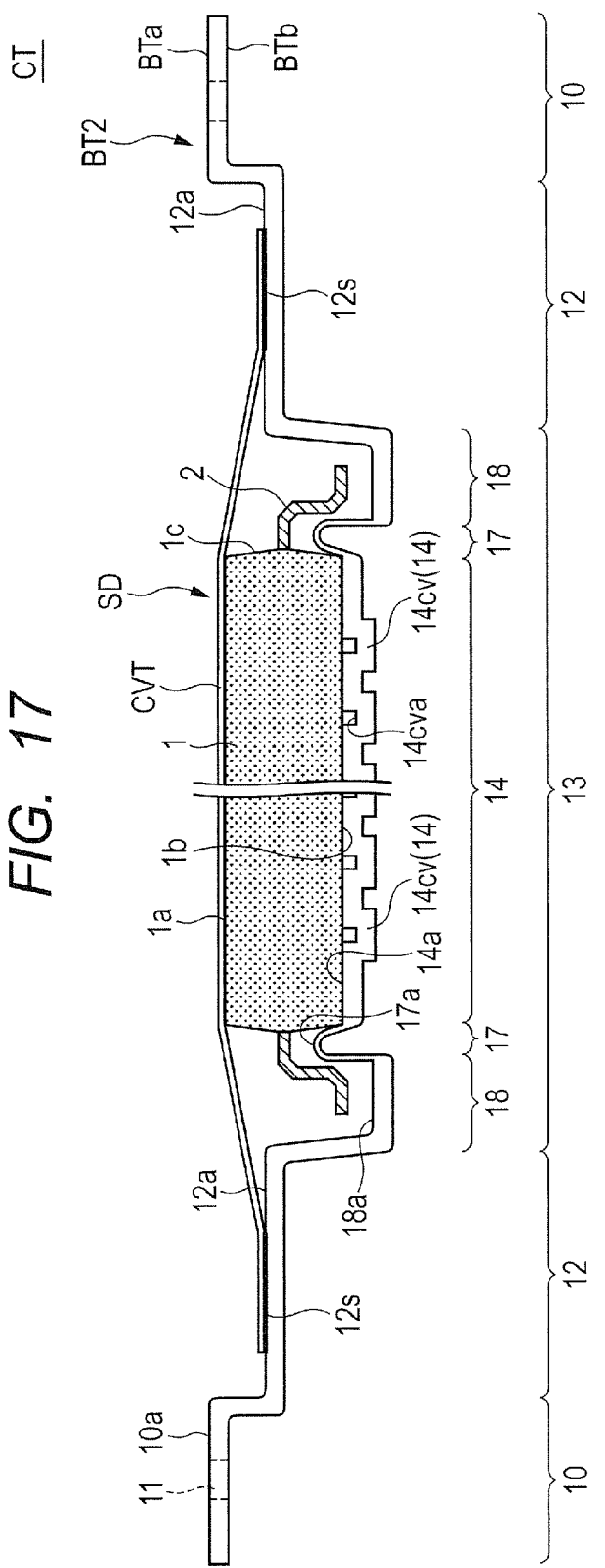
FIG. 17 is a cross-sectional view taken along line E-E in FIG. 16.

FIG. 16 is a plan view of a base carrier tape BT2 in the fourth modification, and corresponds to FIG. 4. FIG. 17 is a cross-sectional view taken along line E-E in FIG. 16, and corresponds to FIG. 9. That is, the fourth modification is different from the above embodiment in that a plurality of concave portions 14cv are formed in the sealing-body placing portion 14, as illustrated in FIG. 16.

As illustrated in FIG. 16, the sealing-body placing portion 14 has the concave portions 14cv that are arranged in X-direction and Y-direction at predetermined intervals in a grid. As illustrated in FIG. 17, principal surfaces 14cva of the concave portions 14cv are spaced away from the rear surface 1b of the sealing body 1, although the rear surface 1b of the sealing body 1 is in contact with the principal surface 14a of the sealing-body placing portion 14.

Because a portion of the pocket portion 13, that is, the sealing-body placing portion 14 is provided with the concave portions 14cv as described above, a bending strength of the pocket portion 13 can be improved. That is, it is possible to reduce the convex warp of the pocket portion 13 when the carrier tape CT is wound around the tape reel TR, so that it is possible to prevent the semiconductor device SD from being displaced or falling out. In other words, deformation of the leads 2 of the semiconductor device SD can be prevented.

Fifth Modification

A fifth modification is directed to the base carrier tape BT1 of the above third modification.

Figure 18:
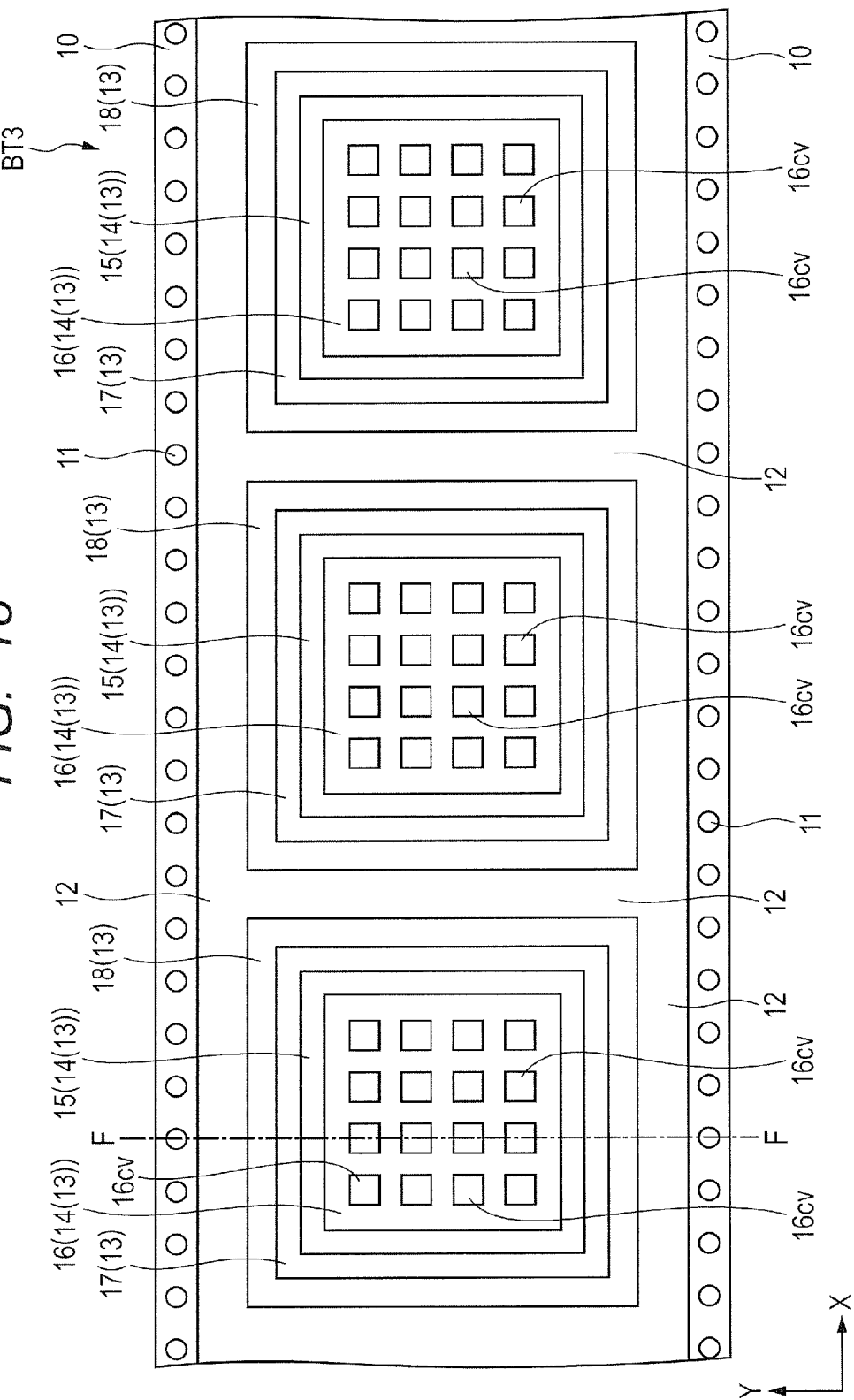
FIG. 18 is a plan view of a base carrier tape in a fifth modification.
Figure 19:
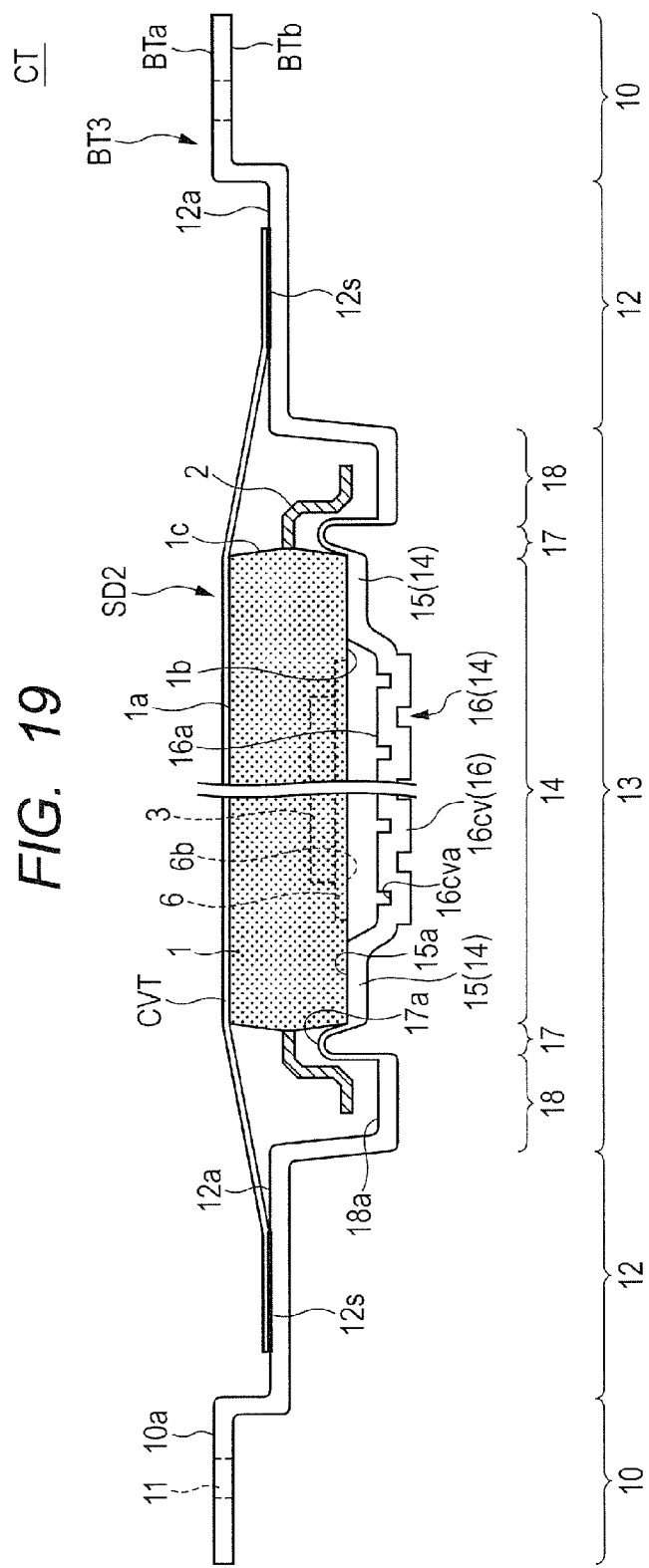
FIG. 19 is a cross-sectional view taken along line F-F in FIG. 18.

FIG. 18 is a plan view of a base carrier tape BT3 in the fifth modification, and corresponds to FIG. 14. FIG. 19 is a cross-sectional view taken along line F-F in FIG. 18, and corresponds to FIG. 15. That is, the fifth modification is different from the above third modification in that a plurality of concave portions 16cv are formed in the dent portion 16 of the sealing-body placing portion 14, as illustrated in FIG. 18.

As illustrated in FIG. 18, the dent portion 16 has the concave portions 16cv that are arranged in X-direction and Y-direction at predetermined intervals in a grid. As illustrated in FIG. 19, the principal surface 16a of the dent portion 16 and principal surfaces 16cva of the concave portions 16cv are spaced away from the rear surface 6b of the die pad 6 exposed from the rear surface 1b of the sealing body 1, although the rear surface 1b of the sealing body 1 is in contact with the principal surface 15a of the rear-surface supporting portion 15 of the sealing-body placing portion 14. According to the fifth modification, the bending strength of the pocket portion 13 can be improved as in the fourth modification.

Sixth Modification

A sixth modification is directed to the base carrier tape BT of the above embodiment.

Figure 20:
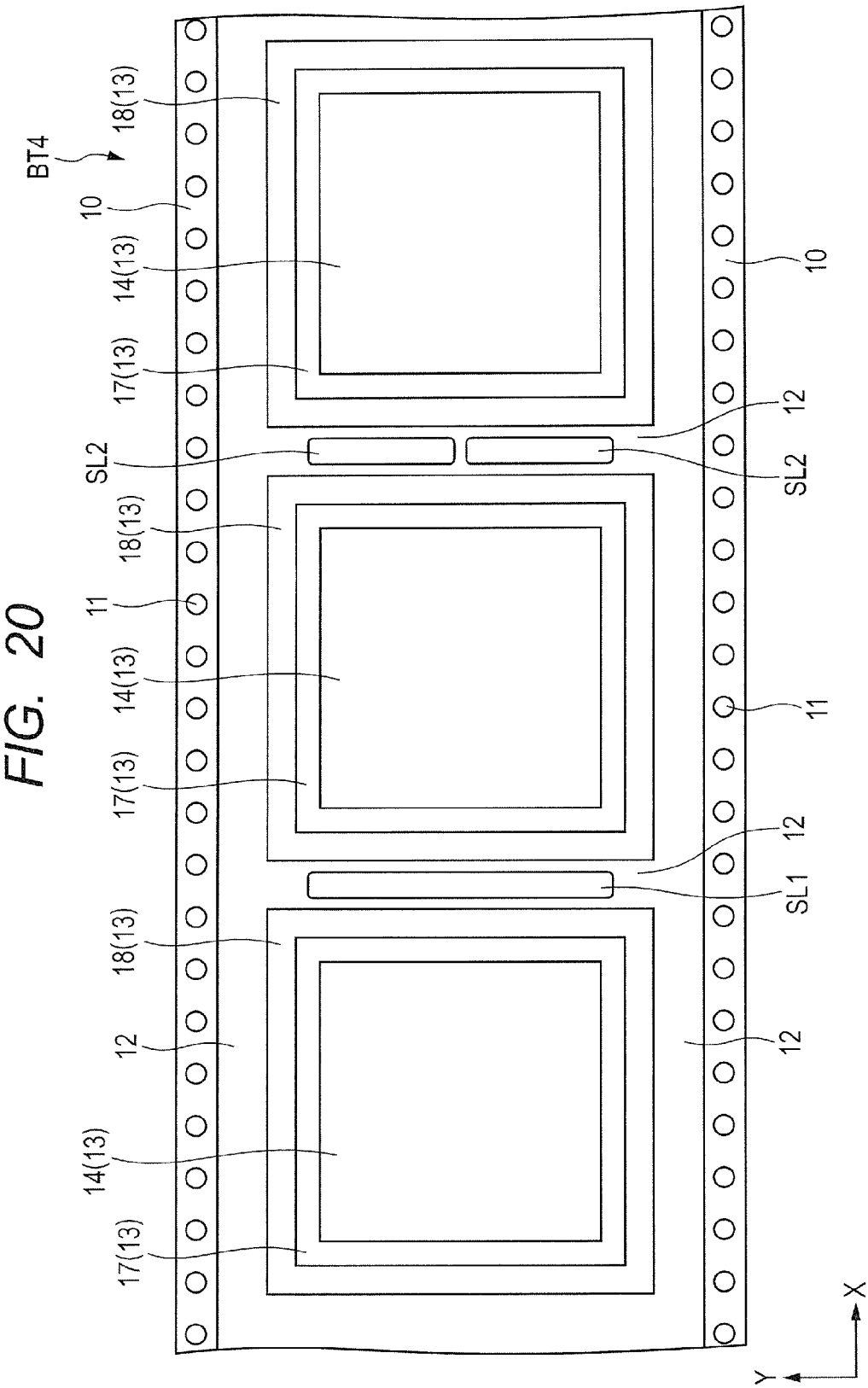
FIG. 20 is a plan view of a base carrier tape in a sixth modification.

FIG. 20 is a plan view of a base carrier tape BT4 in the sixth modification, and corresponds to FIG. 4. As illustrated in FIG. 20, the pocket portion 13 has the sealing-body placing portion 14, the side-surface supporting portions 17, and the lead placing portion 18. A slit SL1 is formed in the step portion 12 between adjacent pocket portions 13. The slit SL1 extends in Y-direction, and it is preferable that the length of the slit SL1 is equal to the width of the pocket portion 13 in Y-direction or is slightly shorter than the width of the pocket portion 13 in Y-direction so that the slit SL1 does not reach the bonding portion 12s illustrated in FIG. 8. The slit SL1 extends through the base carrier tape BT4 in a thickness direction.

Further, as illustrated in FIG. 20, the slit SL1 may be replaced with a plurality of slits SL2 arranged in Y-direction. The same slit SL1 or the same slits SL2 may be provided between adjacent pocket portions 13 in a lengthwise direction (X-direction) of the base carrier tape BT4, or different kinds of slit SL1 and slits SL2 may be provided in a mixed manner. Furthermore, the slit SL1 or the slits SL2 can be replaced with a plurality of rectangular, circular, or oval holes. In addition, it is not always necessary to provide the slit SL1 or the slits SL2 between the adjacent pocket portions 13. Instead, the slit SL1 or the slits SL2 may be provided for every predetermined number of pocket portions 13.

Because the slit SL1 or the slits SL2 are provided between the pocket portions, the base carrier tape BT4 is bent between the pocket portions when the carrier tape CT is wound around the tape reel TR. Therefore, the convex warp of the pocket portion 13 can be reduced, and the semiconductor device SD can be prevented from being displaced or falling out.

What is claimed is:

1. A packing method for a semiconductor device comprising the steps of:
   (a) preparing a plurality of semiconductor devices and each of the plurality of semiconductor devices including a sealing body that has a first principal surface, a rear surface opposite to the first principal surface, and a side surface between the first principal surface and the rear surface, and a plurality of leads that project from the side surface of the sealing body and are bent toward the rear surface;
   (b) preparing a base carrier tape including a first peripheral portion and a second peripheral portion that extend in a first direction and are each provided with a plurality of holes, a step portion that is located between the first peripheral portion and the second peripheral portion in a second direction perpendicular to the first direction and extends in the first direction, and a plurality of pocket portions in the step portion arranged in the first direction;
   (c) placing each of the plurality of semiconductor devices in each of the pocket portions of the base carrier tape;
   (d) bonding a cover tape to the step portion of the base carrier tape to cover the semiconductor device in such a manner that the sealing body is pressed against the base carrier tape; and
   (e) winding the base carrier tape with the semiconductor device placed therein and with the cover tape bonded thereto, around a tape reel,
   wherein the base carrier tape has a first surface in which the semiconductor device is to be placed and a second surface opposite to the first surface,
   wherein the first surface has second principal surfaces of the first peripheral portion and the second peripheral portion, a third principal surface of the step portion, and a fourth principal surface of each of the pocket portions,
   wherein in the step (d), in a cross-sectional view along the second direction,
   the fourth principal surface and the rear surface of the sealing body are in contact with each other,
   the third principal surface is located between the second principal surfaces and the fourth principal surface, and a height from the fourth principal surface to the first principal surface of the sealing body is higher than a height from the fourth principal surface to the third principal surface of the step portion.

2. The packing method for the semiconductor device according to claim 1,
wherein in the step (d), in the cross-sectional view along the second direction,
the height from the fourth principal surface to the first principal surface of the sealing body is equal to or lower than a height from the fourth principal surface to the second principal surfaces of the first peripheral portion and the second peripheral portion.

3. The packing method for the semiconductor device according to claim 1,
wherein in the step (d), in the cross-sectional view along the second direction,
the cover tape has a third surface that is in contact with the first principal surface of the sealing body and a fourth surface opposite to the third surface, and
a height from the fourth principal surface to the fourth surface located over the sealing body is equal to or lower than a height from the fourth principal surface to the second principal surfaces.

4. The packing method for the semiconductor device according to claim 1,
wherein a thickness of the cover tape is thinner than a thickness of a step between the second principal surfaces and the third principal surface in a cross-sectional view.

5. The packing method for the semiconductor device according to claim 1,
wherein in the step (d),
the cover tape is bonded to the base carrier tape between the first peripheral portion and the second peripheral portion, and the pocket portion and between the pocket portions.

6. The packing method for the semiconductor device according to claim 1,
wherein a concave portion is formed in the fourth principal surface of each of the pocket portions.

7. The packing method for the semiconductor device according to claim 1,
wherein a first slit extending in the second direction is formed in the base carrier tape between the pocket portions.

8. The packing method for the semiconductor device according to claim 7,
wherein a second slit adjacent to the first slit in the second direction is formed in the base carrier tape between the pocket portions.

9. The packing method for the semiconductor device according to claim 1,
wherein the step portion and the pocket portions are formed by embossing the base carrier tape.

10. A packing method for a semiconductor device comprising the steps of:
(a) preparing a plurality of semiconductor devices and each of the plurality of semiconductor devices including a sealing body that has a first principal surface, a rear surface opposite to the first principal surface, and a side surface between the first principal surface and the rear surface, a plurality of leads that project from the side surface of the sealing body and are bent toward the rear surface, a semiconductor chip located within the sealing body, and a die pad that having one surface on which the semiconductor chip is mounted and another surface that is opposite to the one surface and has a portion exposed from the rear surface of the sealing body;
(b) preparing a base carrier tape including a first peripheral portion and a second peripheral portion that extend in a first direction and are each provided with a plurality of holes, a step portion that is located between the first peripheral portion and the second peripheral portion in a second direction perpendicular to the first direction and extends in the first direction, and a plurality of pocket portions in the step portion arranged in the first direction;
(c) placing each of the plurality of semiconductor devices in each of the pocket portions of the base carrier tape;
(d) bonding a cover tape to the step portion of the base carrier tape to cover the semiconductor device in such a manner that the sealing body is pressed against the base carrier tape; and
(e) winding the base carrier tape with the semiconductor device placed therein and with the cover tape bonded thereto, around a tape reel,
wherein each of the pocket portions includes a sealing-body placing portion and a lead placing portion,
wherein the sealing-body placing portion includes a supporting portion to be in contact with the rear surface of the sealing body and a dent portion spaced away from the rear surface of the sealing body,
wherein the base carrier tape includes a first surface in which the semiconductor device is placed and a second surface opposite to the first surface,
wherein the first surface includes second principal surfaces of the first peripheral portion and the second peripheral portion, a third principal surface of the step portion, a fourth principal surface of the supporting portion, and a fifth principal surface of the dent portion,
wherein the fifth principal surface of the dent portion is surrounded by the fourth principal surface of the supporting portion in a plan view,
wherein in the step (d), in a cross-sectional view along the second direction,
the third principal surface of the step portion is located between the second principal surfaces and the fourth principal surface,
a height from the fourth principal surface to the third principal surface is lower than a height from the fourth principal surface to the second principal surfaces,
a height from the fifth principal surface to the fourth principal surface is lower than a height from the fifth principal surface to the third principal surfaces, and
a height from the fourth principal surface to the first principal surface of the sealing body is higher than a height from the fourth principal surface to the third principal surface of the step portion.

11. The packing method for the semiconductor device according to claim 10,
wherein in the step (d), in the cross-sectional view along the second direction,
the height from the fourth principal surface to the first principal surface of the sealing body is equal to or lower than the height from the fourth principal surface to the second principal surfaces of the first peripheral portion and the second peripheral portion.

12. The packing method for the semiconductor device according to claim 10,
wherein in the step (d), in the cross-sectional view along the second direction, the cover tape includes a third surface that is in contact with the first principal surface of the sealing body and a fourth surface opposite to the third surface, and a height from the fourth principal surface to the fourth surface located over the sealing body is equal to or lower than the height from the fourth principal surface to the second principal surfaces.

13. The packing method for the semiconductor device according to claim 10, wherein in a cross-sectional view, the portion of the die pad, exposed from the rear surface of the sealing body, is located in the dent portion.

14. The packing method for the semiconductor device according to claim 10, wherein a plurality of concave portions are formed in the fifth principal surface of the dent portion.

15. The packing method for the semiconductor device according to claim 10, wherein the step portion and the pocket portions are formed by embossing the base carrier tape.

* * * * *